United States Patent
Kim et al.

(10) Patent No.: US 9,176,375 B2
(45) Date of Patent: Nov. 3, 2015

(54) METHODS OF REDUCING A REGISTRATION ERROR OF A PHOTOMASK, AND RELATED PHOTOMASKS AND METHODS OF MANUFACTURING AN INTEGRATED CIRCUIT

(71) Applicants: Sang-hyun Kim, Hwaseong-si (KR); Seong-sue Kim, Seoul (KR); Dong-gun Lee, Hwaseong-si (KR); Chalykh Roman, Suwon-si (KR); Mun-ja Kim, Suwon-si (KR)

(72) Inventors: Sang-hyun Kim, Hwaseong-si (KR); Seong-sue Kim, Seoul (KR); Dong-gun Lee, Hwaseong-si (KR); Chalykh Roman, Suwon-si (KR); Mun-ja Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/176,565

(22) Filed: Feb. 10, 2014

(65) Prior Publication Data
US 2014/0363633 A1   Dec. 11, 2014

(30) Foreign Application Priority Data

Jun. 11, 2013 (KR) .................. 10-2013-0066795

(51) Int. Cl.
*G03F 1/72* (2012.01)
*G03F 1/74* (2012.01)

(52) U.S. Cl.
CPC .. *G03F 1/72* (2013.01); *G03F 1/74* (2013.01); *Y10T 428/24802* (2013.01)

(58) Field of Classification Search
CPC ..................................... G03F 1/72; G03F 1/74
USPC ....................................................... 430/5, 22
See application file for complete search history.

(56) References Cited

U.S. PATENT DOCUMENTS

| | | | |
|---|---|---|---|
| 5,503,950 A | 4/1996 | Miyake et al. | |
| 6,042,995 A | 3/2000 | White | |
| 6,821,682 B1 | 11/2004 | Stearns et al. | |
| 7,049,033 B2 | 5/2006 | Stearns et al. | |
| 7,247,412 B2 | 7/2007 | Lee | |
| 2012/0009511 A1* | 1/2012 | Dmitriev | 430/5 |

FOREIGN PATENT DOCUMENTS

| | | |
|---|---|---|
| JP | 2004-095980 | 3/2004 |
| JP | 2010-225698 | 10/2010 |
| KR | 10-2013-0067331 A | 6/2013 |

* cited by examiner

*Primary Examiner* — Christopher Young
(74) *Attorney, Agent, or Firm* — Myers Bigel Sibley & Sajovec, P.A.

(57) ABSTRACT

Methods of reducing a registration error of a photomask are provided. A method of reducing a registration error of a photomask may include identifying the registration error with respect to a pattern element in a pattern region of the photomask. Moreover, the method may include reducing a thickness of a portion of a non-pattern region of the photomask by irradiating an energy beam onto a location of the non-pattern region of the photomask that is spaced apart from the pattern element, to generate stress at the pattern element. Related photomasks and methods of manufacturing an integrated circuit are also provided.

20 Claims, 14 Drawing Sheets

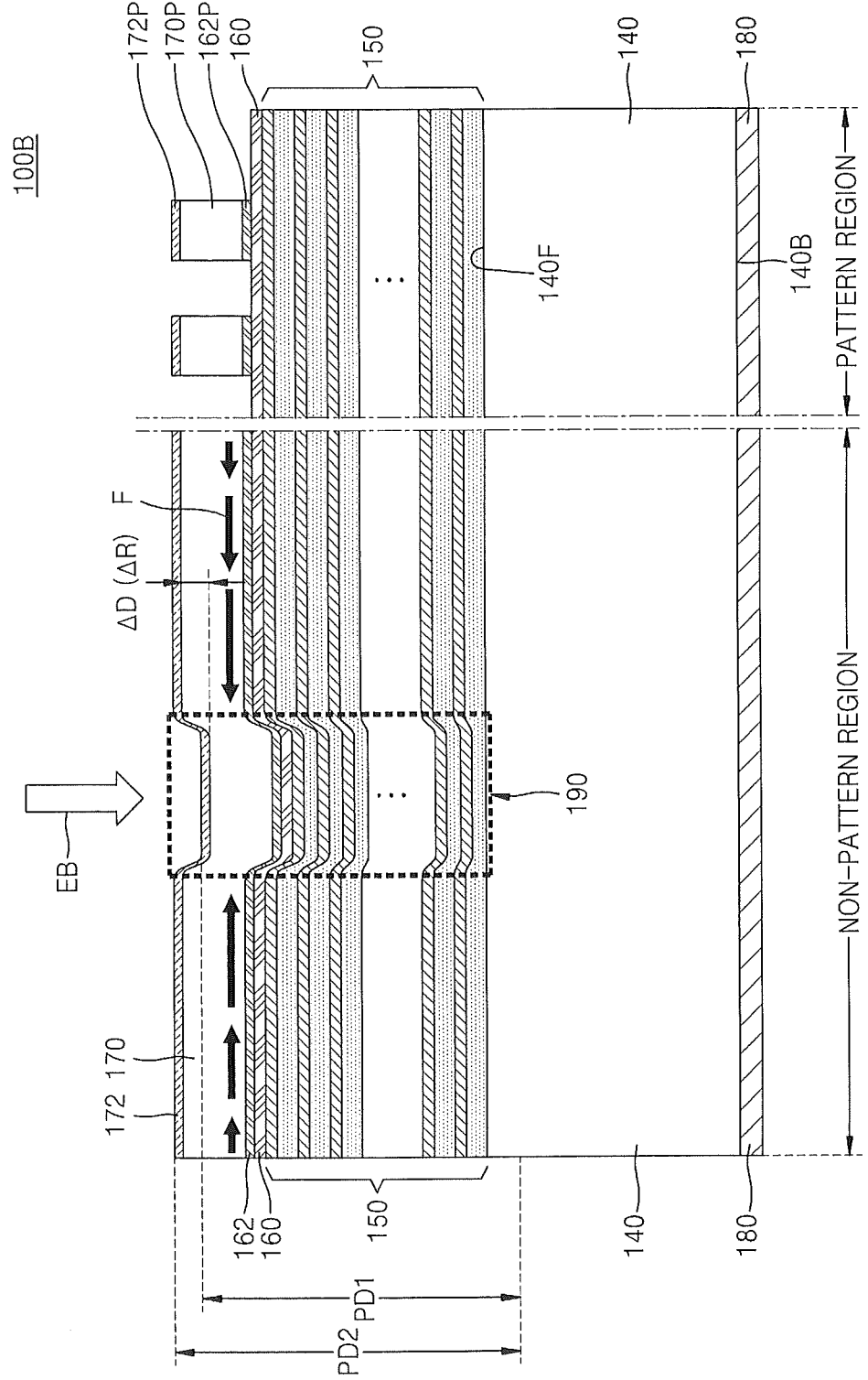

(X/Y) = (10.98/10.74)

| PATTERN ELEMENT | A | B | C | D |
|---|---|---|---|---|
| BEFORE CORRECTION (X/Y), nm |  (4.46/-0.26) |  (-4.54/0.20) |  (-1.00/-5.15) |  (0.51/4.36) |

| PATTERN ELEMENT | A | B | C | D |
|---|---|---|---|---|
| BEFORE CORRECTION (X/Y), nm |  (-0.38/-0.52) |  (1.12/0.13) |  (-0.24/-0.51) |  (0.01/-0.67) |

(X/Y) = (11.3/9.89)

METHODS OF REDUCING A REGISTRATION ERROR OF A PHOTOMASK, AND RELATED PHOTOMASKS AND METHODS OF MANUFACTURING AN INTEGRATED CIRCUIT

CROSS-REFERENCE TO RELATED APPLICATION

This U.S. non-provisional patent application claims priority under 35 U.S.C. §119 to Korean Patent Application No. 10-2013-0066795, filed on Jun. 11, 2013, in the Korean Intellectual Property Office, the disclosure of which is hereby incorporated herein in its entirety by reference.

BACKGROUND

The present disclosure herein relates to photomasks. As design rules of semiconductor apparatuses have become smaller, a wavelength of light used in an exposure process has reduced, too. Therefore, extreme ultraviolet (EUV) light having a short wavelength may be used in the exposure process. When mass producing nano-scale semiconductor devices of 40 nanometers (nm) or less, an EUV lithography using EUV light having a wavelength ranging from about 10 to about 14 nm may be used.

When forming a plurality of fine patterns that are arranged at high density by using the EUV lithography process, the EUV light having high energy may be absorbed by an absorber layer of a photomask and may not reach a wafer. Accordingly, research on a technology of transferring patterns on a wafer by using a reflective type exposure system including a reflective EUV photomask has been actively conducted recently. Because of the reflective photomask, patterns on the photomask may be transferred onto the wafer via a scanning process. Therefore, a defect of the photomask may cause a defect of a device formed on the wafer.

In particular, in a case where a registration error occurs on the photomask, a wafer overlay error may occur. Then, the overlay error may be transferred onto the wafer, and a wafer defect may occur.

SUMMARY

Various embodiments of the present inventive concepts provide a reflective photomask that may be used in an extreme ultraviolet (EUV) photolithography process, and may be capable of reducing a registration error to reduce/prevent a wafer overlay error.

Various embodiments of the present inventive concepts provide a method of reducing a registration error of a photomask. The method may include measuring the registration error with respect to a pattern element in a main pattern region configured to transfer main patterns for an integrated circuit on a chip region of a wafer. The photomask may include the main pattern region, an auxiliary pattern region configured to transfer auxiliary patterns on a scribe line region of the wafer, and a black border region around the main pattern region and the auxiliary pattern region. The method may include identifying a first direction, to which the pattern element is shifted from a nominal position, using a result of measuring the registration error. Moreover, the method may include changing a strain of the photomask at a location of the pattern element by physically deforming the photomask at a selection point that is spaced apart from the location of the pattern element in a second direction that is different from the first direction and is in at least one of the auxiliary pattern region and the black border region.

According to various embodiments, changing the strain may include determining a distance from the location of the pattern element to the selection point to adjust a variation amount of the strain. In some embodiments, changing the strain may include applying a tensile stress to the location of the pattern element. In some embodiments, changing the strain may include reducing a thickness of the photomask at the selection point. Moreover, changing the strain may include controlling a thickness variation amount of the photomask at the selection point to adjust a variation amount of the strain.

In various embodiments, changing the strain may include increasing a density of a portion of the photomask in a vertical region extending from the selection point along a thickness direction of the photomask. In some embodiments, changing the strain may include reducing a thickness of the photomask at the selection point such that an upper surface of the photomask at the selection point is at a first level lower than a second level at which an upper surface of an adjacent portion of the photomask is located. Moreover, changing the strain may include irradiating an energy beam onto the selection point. The energy beam may include one of an electron beam, a focused ion beam, a laser beam, and an electromagnetic beam.

According to various embodiments, the photomask may include a multi-layer pattern including a plurality of reflective layers, and changing the strain may include increasing a temperature of a vertical region of the photomask extending from the selection point in a thickness direction of the photomask to a melting point of at least one material of the multi-layer pattern to reduce a volume of the multi-layer pattern in the vertical region.

A photomask, according to various embodiments, may include a photomask substrate including a main pattern region configured to transfer main patterns for an integrated circuit on a chip region of a wafer, an auxiliary pattern region configured to transfer auxiliary patterns on a scribe line region of the wafer, and a black border region around the main pattern region and the auxiliary pattern region. The photomask may include an absorber layer on the photomask substrate in the main pattern region, the auxiliary pattern region, and the black border region. In some embodiments, an integrated circuit may be manufactured using the photomask. Moreover, the absorber layer may include at least two absorbing regions including respective upper surfaces located at different distances from the photomask substrate in at least one of the auxiliary pattern region and the black border region to apply a stress to the main pattern region.

According to various embodiments, the photomask may include a multi-layer pattern including a plurality of reflective layers between the photomask substrate and the absorber layer in the main pattern region, the auxiliary pattern region, and the black border region. Moreover, the multi-layer pattern may include at least two reflective regions including different respective densities at locations corresponding to the at least two absorbing regions.

In various embodiments, the at least two absorbing regions may include a first absorbing region including a first upper surface separated a first distance from the photomask substrate, and a second absorbing region including a second upper surface separated from the photomask substrate by a second distance that is shorter than the first distance. Moreover, the multi-layer pattern may include a first reflective region including a first density at a first location that is vertically overlapped by the first absorbing region, and a second reflective region including a second density that is greater than the first density at a second location that is vertically overlapped by the second absorbing region. In some embodiments, the absorber layer may include a material configured to absorb extreme ultraviolet (EUV) light. In some embodiments, the multi-layer pattern may include a structure in which at least two material layers are repeatedly and alternately stacked, and one of the at least two material layers may include silicon.

A method of manufacturing an integrated circuit, according to various embodiments, may include providing a wafer including a feature layer, forming a photoresist layer on the feature layer, and providing a photomask including a pattern region and a non-pattern region. The method may include reducing a registration error of the photomask by applying an energy beam onto at least one selection point of the non-pattern region of the photomask to change a strain in the pattern region of the photomask. Moreover, the method may include exposing the photoresist layer using the photomask for which the registration error is reduced, forming a photoresist pattern by developing the photoresist layer, and processing the feature layer using the photoresist pattern. In some embodiments, exposing the photoresist layer may include exposing the photoresist layer to extreme ultraviolet (EUV) light reflected by the photomask.

According to various embodiments, the photomask may include a photomask substrate extending throughout the pattern region and the non-pattern region, a multi-layer pattern including a plurality of reflective layers on the photomask substrate in the pattern region and the non-pattern region, and an absorber layer on the multi-layer pattern in the non-pattern region. Moreover, the multi-layer pattern may include a first reflective region on the pattern region and including a first density, and a second reflective region on the non-pattern region at a location corresponding to the at least one selection point and including a second density that is greater than the first density. In some embodiments, applying the energy beam may include heating the multi-layer pattern to reduce a thickness of the multi-layer pattern in the non-pattern region.

In various embodiments, the photomask may include a photomask substrate extending throughout the pattern region and the non-pattern region, a multi-layer pattern including a plurality of reflective layers on the photomask substrate in the pattern region and the non-pattern region, and an absorber layer on the multi-layer pattern in the non-pattern region. Moreover, the absorber layer may include a first absorbing region including an upper surface separated a first distance from the photomask substrate in the non-pattern region, and a second absorbing region at a location corresponding to the at least one selection point and including an upper surface separated from the photomask substrate by a second distance that is less than the first distance. In some embodiments, applying the energy beam may include heating the multi-layer pattern to reduce a thickness of the multi-layer pattern in the non-pattern region. In some embodiments, the absorber layer may include at least three absorbing regions including respective upper surfaces at different distances, respectively, from the photomask substrate, in the non-pattern region.

According to various embodiments, the photomask may include a main pattern region, an auxiliary pattern region, and a black border region around the main pattern region and the auxiliary pattern region. The pattern region of the photomask may be in the main pattern region, and the non-pattern region of the photomask may be in the auxiliary pattern region or the black border region. In some embodiments, processing the feature layer may include etching the feature layer using the photoresist pattern as an etching mask to form a feature pattern. In some embodiments, processing the feature layer may include implanting impurity ions into the feature layer using the photoresist pattern as an ion implantation mask. Moreover, processing the feature layer may include forming a process film on the feature layer that is exposed via the photoresist pattern.

A method of reducing a registration error of a photomask, according to various embodiments, may include identifying the registration error with respect to a pattern element in a pattern region of the photomask. The method may include selecting a location on a non-pattern region of the photomask that is a predetermined distance apart from the pattern element. Moreover, the method may include reducing a thickness of a portion of the non-pattern region of the photomask by irradiating an energy beam onto the location of the non-pattern region of the photomask that is the predetermined distance apart from the pattern element, to generate stress at the pattern element. In some embodiments, irradiating the energy beam onto the location of the non-pattern region may include controlling an intensity of the energy beam to control the stress at the pattern element.

According to various embodiments, the non-pattern region of the photomask may include a multi-layer pattern including a plurality of reflective layers. Moreover, irradiating the energy beam onto the location of the non-pattern region may include heating the multi-layer pattern to reduce a thickness of the multi-layer pattern. In some embodiments, the photomask may include an extreme ultraviolet (EUV) photomask, identifying the registration error may include identifying the registration error with respect to the pattern element in the pattern region of the EUV photomask, and heating the multi-layer pattern may include controlling the registration error with respect to the pattern element in the pattern region of the EUV photomask by controlling the thickness of the multi-layer pattern.

In various embodiments, selecting the location may include selecting first and second locations on the non-pattern region of the photomask. Moreover, reducing the thickness may include reducing first and second thicknesses of first and second portions, respectively, of the non-pattern region of the photomask by irradiating first and second energy beams including respective first and second intensities onto the first and second locations, respectively, of the non-pattern region of the photomask.

BRIEF DESCRIPTION OF THE DRAWINGS

The above and other features and advantages of the disclosure will become more apparent in view of the attached drawings and accompanying detailed description.

FIGS. 3A and 3B are a plan view and a cross-sectional view, respectively, of a photomask after correcting a registration error, according to various embodiments of the present inventive concepts.

DETAILED DESCRIPTION

Figure 1:
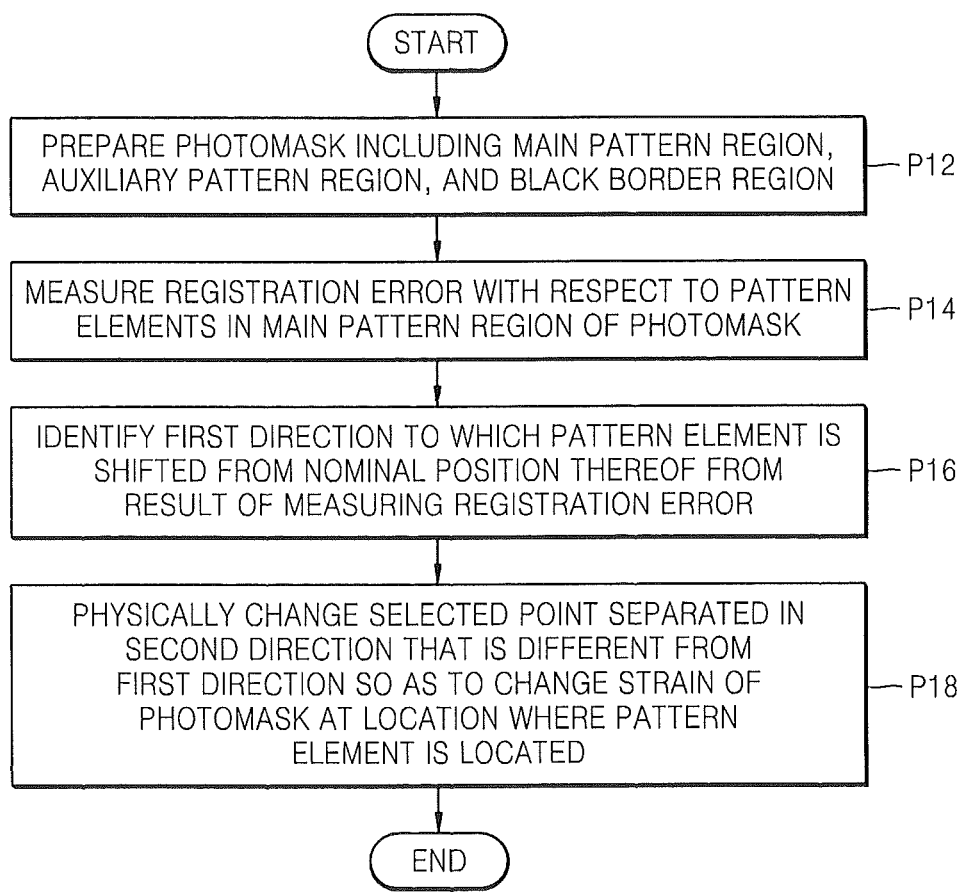
FIG. 1 is a flowchart illustrating a method of correcting a registration error of a photomask, according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordinglyf an embodiment is differently realizable, a specified operation order may be differently performed from a described order. For example, two consecutive operations may be substantially simultaneously performed, or in an order opposite to the described order.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2A:
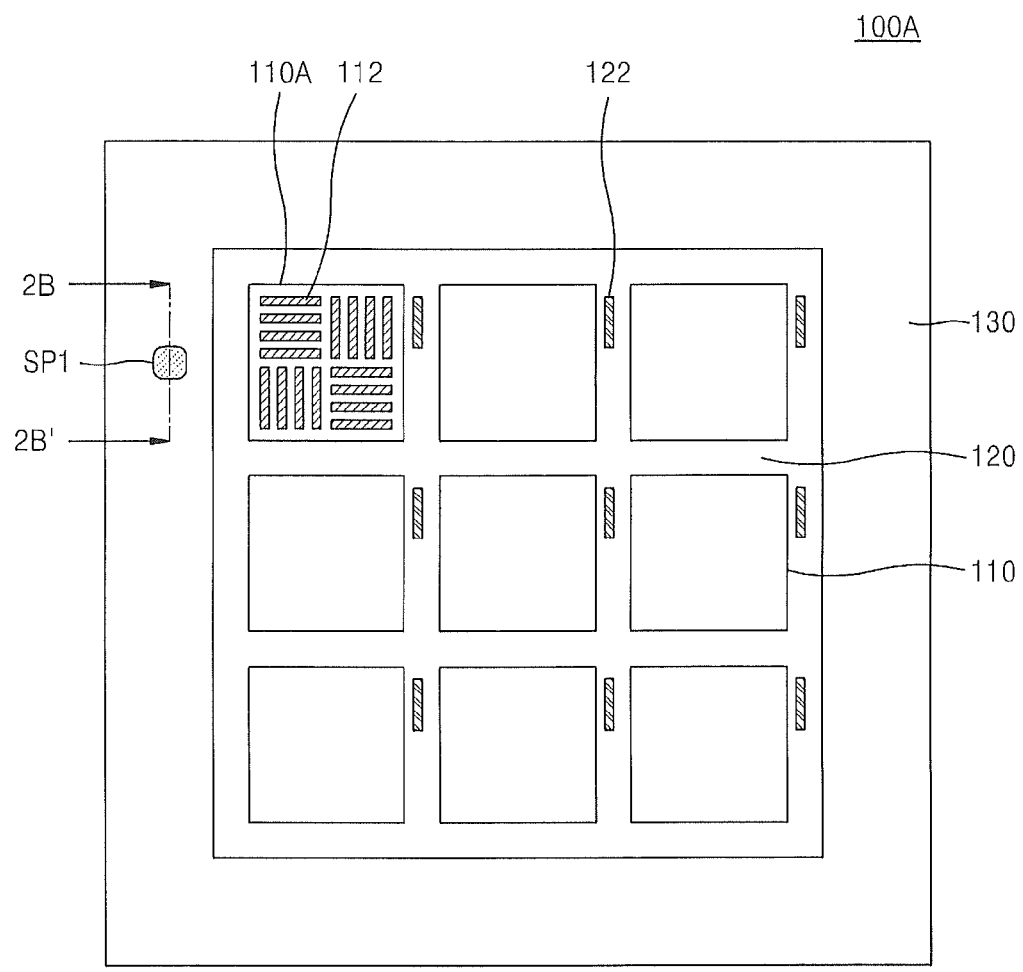
FIGS. 2A and 2B are a plan view and a cross-sectional view, respectively, of a photomask before correcting a registration error.
Figure 2B:
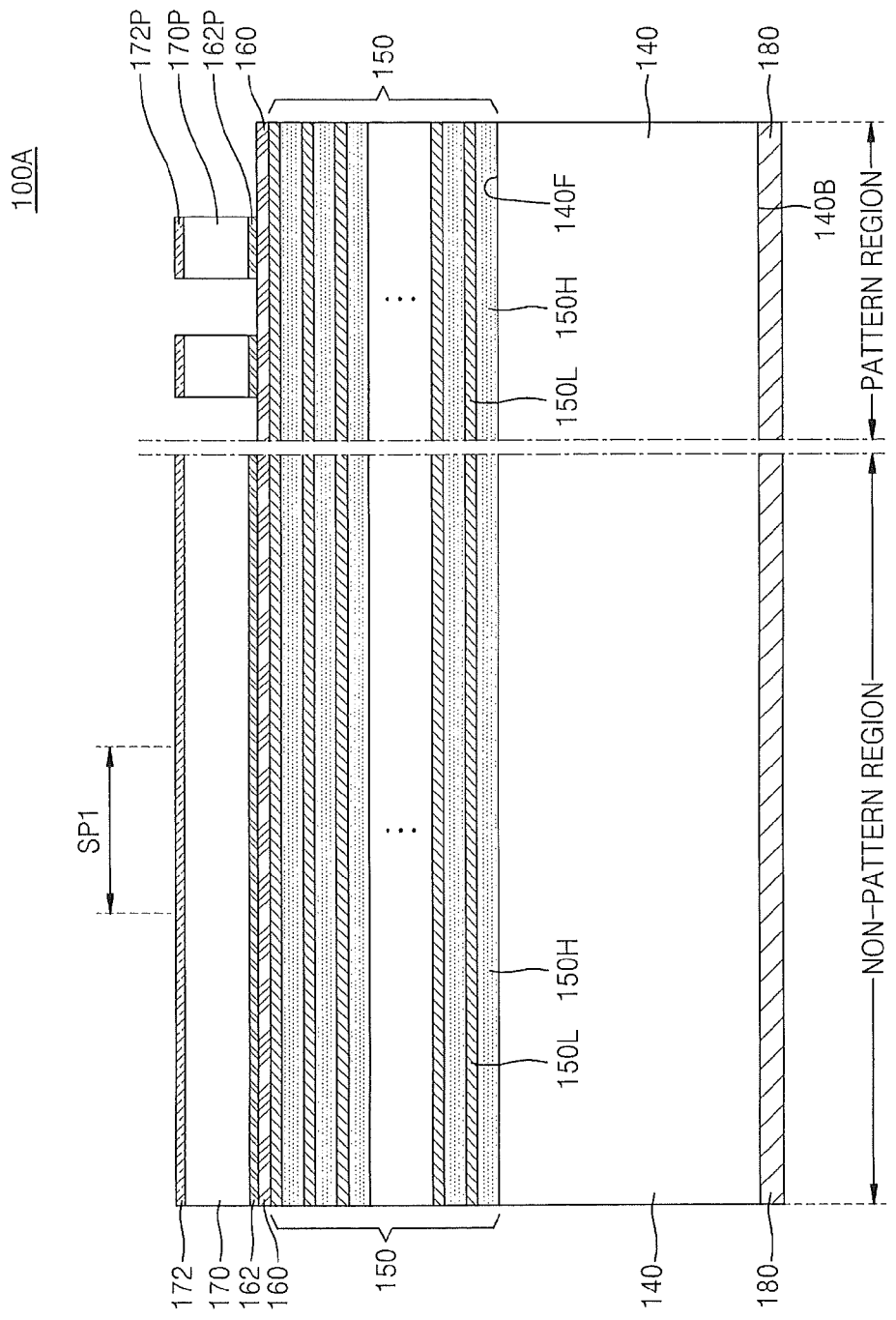
Figure 3A:
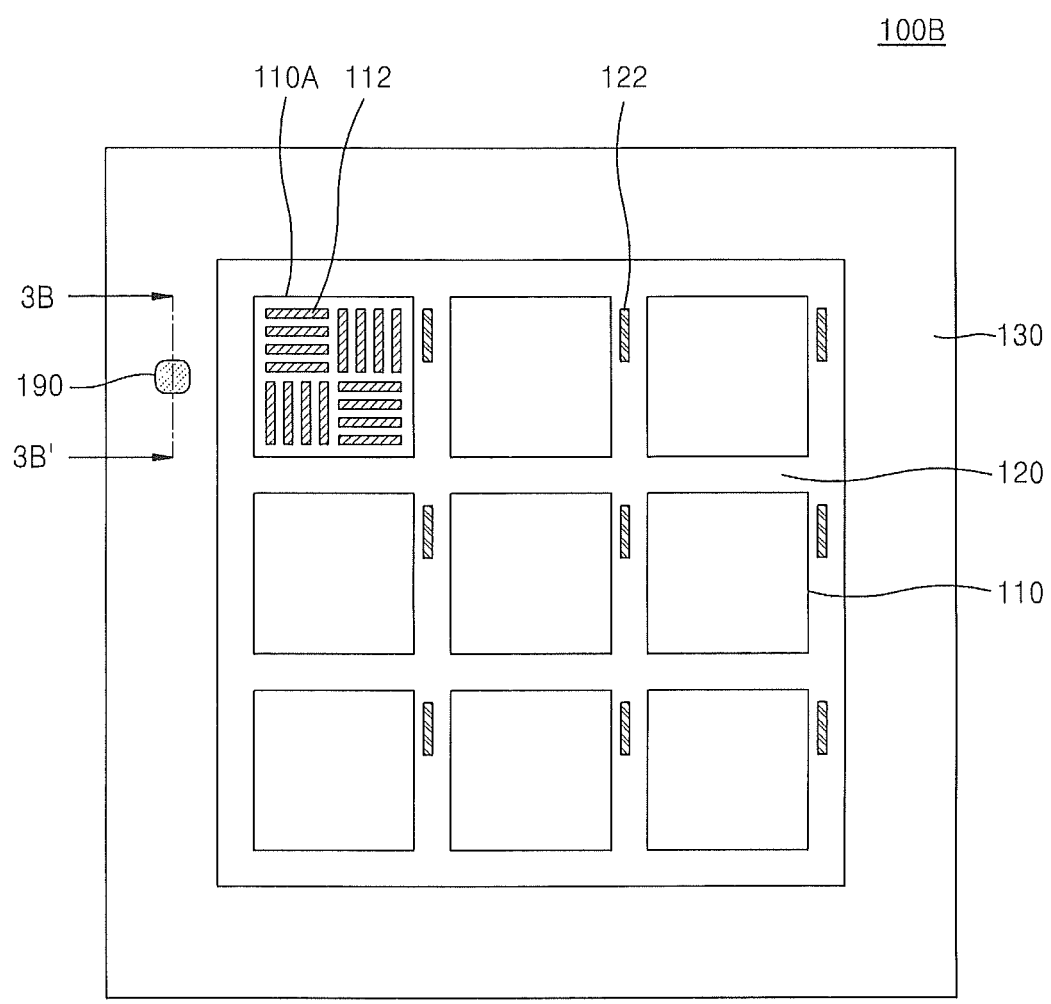

FIG. 1 is a flowchart illustrating a method of correcting a registration error of a photomask, according to various embodiments of the present inventive concepts. FIGS. 2A through 3B are diagrams illustrating the method of correcting the registration error of the photomask, according to various embodiments of the present inventive concepts, in a processing order. FIGS. 2A and 2B are a plan view and a cross-sectional view, respectively, schematically showing a photomask 100A before correcting the registration error, and FIGS. 3A and 3B are a plan view and a cross-sectional view, respectively, schematically showing a photomask 100B after correcting the registration error. In FIG. 2B, a non-pattern region is taken along line 2B-2B' of FIG. 2A. In addition, in FIG. 3B, a non-pattern region is taken along line 3B-3B' of FIG. 3A. A pattern region shown in FIGS. 2B and 3B is also described herein.

Referring to FIGS. 1, 2A, and 2B, a photomask 100A is prepared in operation P12. The photomask 100A is a reflective type photomask for manufacturing an integrated circuit such as a semiconductor device by transferring patterns on a wafer through an exposure process. In some embodiments, the photomask 100A is used in a photolithography using exposure light having an extreme ultraviolet (EUV) wavelength, for example, a wavelength of about 13.5 nanometers (nm), and is a reflective type photomask based on a multiple mirror layer.

The photomask 100A includes a main pattern region 110 for transferring a main pattern that is necessary for forming a unit device configuring an integrated circuit on a chip area of a wafer, an auxiliary pattern region 120 for transferring a scribe line region on the wafer, and a black border region 130 surrounding the main pattern region 110 and the auxiliary pattern region 120.

The black border region 130 is a non-pattern region that does not include a pattern element for transferring the pattern on the wafer. The auxiliary pattern region 120 may include the pattern region and the non-pattern region shown in the example of FIG. 2B. The pattern region of the auxiliary pattern region 120 does not include a pattern for configuring an integrated circuit that is to be formed, but includes auxiliary pattern elements 122 for transferring auxiliary patterns that are necessary in manufacturing the integrated circuit and do not remain on a final product of the integrated circuit, for example, align key patterns on the scribe line region of the wafer. The non-pattern region of the auxiliary pattern region 120 does not include pattern elements to be transferred on the wafer.

At least a part of the main pattern region 110 corresponds to a pattern region on which pattern elements 112 forming a main pattern for transferring a pattern that is necessary for forming the integrated circuit on a chip area of the wafer. In some embodiments, an entire area of the main pattern region 110 may correspond to the pattern region on which the main pattern elements 112 are formed. In some embodiments, only a part of the main pattern region 110 may correspond to the pattern region, and the other part of the main pattern region 110 may correspond to the non-pattern region on which the main pattern elements 112 are not formed.

In some embodiments, the non-pattern region of the photomask 100A shown in FIG. 2B corresponds to a part of the black border region 130 that does not include the pattern elements to be transferred on the wafer. In some embodiments, the non-pattern region of the photomask 100A shown in FIG. 2B corresponds to a part of the auxiliary pattern region 120, on which the auxiliary pattern elements to be transferred on the wafer are not formed. In addition, in some other elements, the non-pattern region of the photomask 100A shown in FIG. 2B may correspond to a part of the main pattern region 110, on which the pattern to be transferred on the chip area of the wafer is not formed.

In some embodiments, the main pattern region 110 may not include the non-pattern region. In addition, the non-pattern region of FIG. 2B may correspond to a configuration that is included in at least one of the auxiliary pattern region 120 and the black border region 130.

In some embodiments, the pattern region of the photomask 100A shown in FIG. 2B may correspond to a portion of the main pattern region 110, on which the main pattern elements 112 are formed. In some embodiments, the pattern region of the photomask 100A shown in FIG. 2B may correspond to a portion of the auxiliary pattern region 120, on which the auxiliary pattern elements 122 are formed.

Referring to FIGS. 2A and 2B, the photomask 100A may include a photomask substrate 140 including the main pattern region 110, the auxiliary pattern region 120, and the black border region 130. The photomask substrate 140 may be formed of a dielectric material, a glass material, semiconductor, or a metal material. In some embodiments of the present inventive concepts, the photomask substrate 140 may be formed of a material having a low thermal expansion coefficient. For example, the photomask substrate 140 may have a thermal expansion coefficient of about $0\pm0.05\times10^{-7}/^\circ$ C. at a temperature of 20° C. Also, the photomask substrate 140 may be formed of a material having excellent smoothness, excellent flatness, and high resistance against a cleaning liquid. For example, the photomask substrate 140 may be formed of a fused silica glass, quartz glass, alumino silicate glass, soda lime glass, low thermal expansion material (LTEM) glass such as silicon dioxide ($SiO_2$)-titanium dioxide ($TiO_2$) based glass, glass ceramics from which β-quartz solid-solution is extracted, single crystalline silicon, or silicon carbide (SiC).

In some embodiments, a frontside surface 140F of the photomask substrate 140 has a flatness of about 50 nm or less, and a surface 140B at a backside of the photomask substrate 140 may have a flatness of about 500 nm or less. Also, the frontside surface 140F and the backside surface 140B of the photomask substrate 140 may have a root mean square (RMS) of about 0.15 nm or less.

In the non-pattern region, a multiple reflective layer 150, a capping layer 160, a buffer layer 162, an absorber layer 170, and a low reflective layer 172 are sequentially formed on the frontside surface 140F of the photomask substrate 140. According to some embodiments, at least one of the buffer layer 162 and the low reflective layer 172 may be omitted. A backside conductive layer 180 is formed on the backside surface 140B of the photomask substrate 140.

Similarly to the non-pattern region, the multiple reflective layer 150 and the capping layer 160 are sequentially formed on the frontside surface 140F of the photomask substrate 140, and the backside conductive layer 180 is formed on the backside surface 140B of the photomask substrate 140 in the pattern region. In addition, a buffer pattern 162P, an absorber pattern 170P, and a low reflective pattern 172P for defining predetermined pattern elements, for example, the main pattern elements 112 located on the main pattern region 110 or the auxiliary pattern elements 122 located on the auxiliary pattern region 120, are sequentially formed on the capping layer 160. At least one of the buffer pattern 162P and the low reflective pattern 172P may be omitted.

The multiple reflective layer 150 has a multiple mirror structure that is obtained by stacking a high refractive index layer 150H and a low refractive index layer 150L alternately for a plurality number of times. For example, the multiple reflective layer 150 may have a structure in which a set of the high refractive index layer 150H and the low refractive index layer 150L is repeatedly stacked by 20 to 60 times. According to some embodiments, the multiple reflective layer may be formed of a molybdenum (Mo)/Si multiple layer, an Mo compound/Si compound multiple layer, a ruthenium (Ru)/Si multiple layer, a beryllium (Be)/Mo multiple layer, a Si/niobium (Nb) multiple layer, a Si/Mo/Ru multiple layer, a Si/Mo/Ru/Mo multiple layer, or a Si/Ru/Mo/Ru multiple layer.

A material forming the multiple reflective layer 150 and a thickness of each layer may be appropriately selected according to a wavelength band of the EUV light or a reflectivity of the EUV light required by the multiple reflective layer 150. For example, if the multiple reflective layer 150 is formed of the Mo/Si multiple layer, a Mo layer corresponding to the low refractive index layer 150L and a Si layer corresponding to the high refractive index layer 150H in the multiple reflective layer 150 may respectively have a thickness of about 2 to about 5 nm.

The multiple reflective layer 150 may be formed by using a direct current (DC) sputtering method, a radio frequency (RF) sputtering method, or an ion beam sputtering method. For example, when the Mo/Si multiple reflective layer is formed by using the ion beam sputtering method, a Si film is deposited by using Si target as a target and an argon (Ar) gas as a sputtering gas, and a Mo film is deposited by using Mo target as a target and an Ar gas as a sputtering gas. Then, the above forming period may be repeatedly performed 40 to 50 times to form the Mo/Si multiple layer.

The capping layer 160 may protect/prevent a surface of the multiple reflective layer 150 from being oxidated. Otherwise, while the absorber layer 170 is dry etched to form the pattern elements to be transferred onto the wafer during the manufacturing process of the photomask 100A, the capping layer 160 may protect the multiple reflective layer 150 not to be damaged.

According to some embodiments, the capping layer 160 may be formed of Ru or a Ru alloy. When the capping layer 160 is formed of a Ru alloy, the Ru alloy may include Ru and at least one selected from Nb, zirconium (Zr), Mo, yttrium (Y), boron (B), lanthanum (La), or a combination thereof. By forming the capping layer 160 by using a material having a low EUV light absorption rate, as shown in FIG. 2B, the capping layer 160 may remain on the multiple reflective layer between the absorber patterns 170P in the pattern region of the photomask 100A.

According to some embodiments, the capping layer 160 may be formed of a Si film. The capping layer 160 formed of Si may have a native oxide layer on a surface thereof. According to some embodiments, if the multiple reflective layer 150 is the Mo/Si multiple reflective layer, the uppermost layer of the multiple reflective layer 150 may be formed of the Si layer so that the Si uppermost layer may function as the capping layer 160. Here, the process of forming an additional capping layer may be omitted. According to some embodiments, the capping layer 160 may have a thickness of about 0.5 nm to about 10 nm.

During dry etching of the absorber layer 170 for forming the pattern elements to be transferred to the wafer in the pattern region in manufacturing the photomask 100A, the buffer layer 162 may protect the multiple reflective layer 150. Also, the buffer layer 162 may protect the multiple reflective layer 150 during a defect correction that is performed in a case where a black spot or a white spot generates in the pattern region during the manufacturing process of the photomask 100A.

The buffer layer 162 may be formed of a material having a very low absorbency of the EUV light. According to some embodiments, the buffer layer 162 and the buffer pattern 162P may be formed of Ru, RuB, RuB, RuSi, chromium (Cr), Cr nitride, aluminum (Al), Al nitride, tantalum (Ta), Ta nitride, $SiO_2$, silicon nitride ($Si_3N_4$), aluminum oxide ($Al_2O_3$), or a combination thereof.

The buffer layer 162 may be formed by using a sputtering process. For example, when the buffer layer 162 is formed as a Ru layer, a magnetron sputtering process using a Ru target as a target and an Ar gas as a sputtering gas is performed to form the buffer layer 162. According to some embodiments, the buffer layer 162 may have a thickness of about 1 nm to about 100 nm.

In a case where the buffer layer 162 is formed of a material having a relatively high absorbency of the EUV light, as shown in FIG. 2B, the buffer layer 162 exposed between the absorber patterns 170P in the pattern region of the photomask 100A may be removed so that the buffer patterns 162P only remain under the absorber patterns 170P.

The absorber layer 170 and the absorber patterns 170P may be formed of a material that absorbs the EUV light and has very low EUV reflectivity. Also, the absorber layer 170 and the absorber patterns 170P may be formed of a material having an excellent chemical resistance. According to some embodiments, the absorber layer 170 and the absorber patterns 170P may be formed of a material having a maximum light reflectivity of about 5% or less around a wavelength of 13.5 nm, when the light having the EUV wavelength is irradiated onto the surfaces of the absorber layer 170 and the absorber patterns 170P.

The absorber layer 170 and the absorber patterns 170P may be formed of a material mainly containing Ta. According to some embodiments, the absorber layer 170 and the absorber patterns may include Ta as a main component, and at least one selected from hafnium (Hf), Si, Zr, germanium (Ge), B, nitrogen (N), and hydrogen (H). For example, the absorber layer 170 and the absorber patterns 170P may be formed of TaN, TaHf, TaHfN, TaBSi, TaBSiN, TaB, TaBN, TaSi, TaSiN, TaGe, TaGeN, TaZr, TaZrN, or a combination thereof. According to some embodiments, the absorber layer 170 and the absorber patterns 170P may be formed of a material having Ta contained by at least 40 atomic %. According to some embodiments, the absorber layer 170 and the absorber patterns 170P may further contain oxygen of about 0 to 25 atomic %.

In a case where the buffer layer 162 is formed of Ru or Ru compound, when the absorber layer 170 is dry etched to form the absorber patterns 170P configuring the pattern elements to be transferred to the wafer from the pattern region during manufacturing of the photomask 100A, a fluoride-based gas may be used as an etching gas to protect/prevent the buffer layer 162 from being damaged.

According to some embodiments, the sputtering process may be performed to form the absorber layer 170; however, embodiments of the present inventive concepts are not limited thereto. According to some embodiments, the absorber layer 170 and the absorber patterns 170P may have a thickness of about 30 nm to about 200 nm.

The low reflective layer 172 and the low reflective patterns 172P provide relatively low reflectivity with respect to a wavelength of inspection light, for example, about 190 nm to about 260 nm, to obtain a sufficient contrast, during inspecting the pattern elements formed in the photomask 100A. For example, the low reflective layer 172 and the low reflective patterns 172P may be formed of TaBO, TaBNO, TaOH, or TaONH. The low reflective layer 172 may be formed by the sputtering process; however, embodiments of the present inventive concepts are not limited thereto. According to some embodiments, the low reflective layer 172 and the low reflective patterns 172P may have a thickness of about 5 nm to about 25 nm.

The backside conductive layer 180 formed on the backside surface 140B of the photomask substrate 140 may be used to support the photomask 100A by using an electrostatic chuck to protect/prevent the photomask 100A from bending in an exposure process. According to some embodiments, the backside conductive layer 180 may be formed of Cr or CrN. The backside conductive layer 180 may have a thickness of about 20 nm to about 80 nm.

Figure 4:
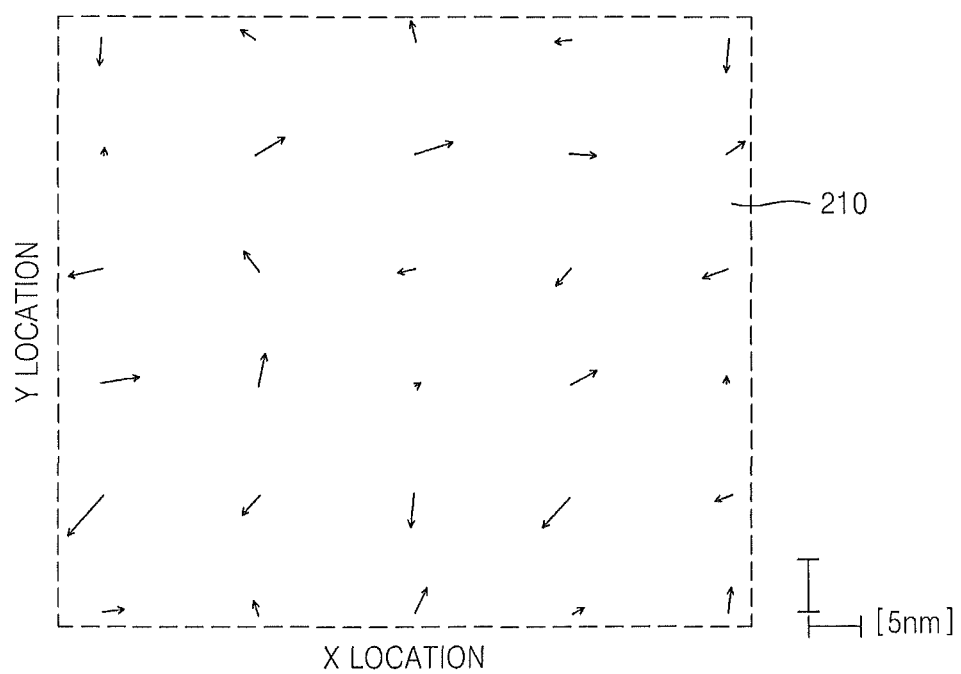
FIG. 4 is a two-dimensional (2D) map showing an example result of measuring a registration error with respect to a plurality of main pattern elements on a part of a main pattern region of the photomask.

Referring back to FIG. 1, a registration error of the main pattern elements 112 formed on the main pattern region 110 of the photomask 100 is measured in operation P14. FIG. 4 is a two dimensional (2D) map showing a result of measuring a registration error with respect to the plurality of main pattern elements 112 in a part of the main pattern region 110 of the photomask 100A.

In general, the registration error of the photomask may occur/generate due to a clamping of the photomask or due to a flatness of the photomask, that is, may be generated when some of the pattern elements 112 in the main pattern region 110 are not exactly located at designated positions. When the registration error of the pattern elements occurs in the photomask, the patterns transferred onto a photoresist on the wafer from the pattern elements may not coincide with a designed shape or may not be transferred to the exact locations on the photoresist.

Distribution of the registration error in the main pattern region 110 of the photomask 100A may be represented as a 2D map 210 of arrows, as shown in FIG. 4. On the 2D map 210, a direction of the arrow represents a shifted direction of the pattern element from a nominal position (X: 0.00, Y: 0.00), and a length of the arrow denotes a shifted amount.

The registration error shown in the 2D map 210 of FIG. 4 may be the registration error measured on a measurement target region selected from the main pattern region 110 of the photomask 100A shown in FIG. 2A, for example, the region 110A. In the 2D map 210 of the registration error shown in FIG. 4, maximum 3 sigma in an X-axis direction is 10.98 nm and maximum 3 sigma in a Y-axis direction is 10.74 nm.

Referring back to FIG. 1, the shifted direction (first direction) of each main pattern element 112 from the nominal position (X: 0.00, Y: 0.00) thereof is identified from the result of measuring the registration error of the main pattern elements 112 in the main pattern region 110 of the photomask 100A, in operation P16.

Figure 5A:
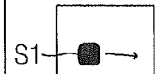
FIG. 5A is a diagram showing separate results of measuring four independent pattern elements located on a main pattern region of the photomask.
Figure 5A:
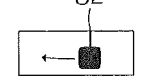
Figure 5A:
Figure 5A:
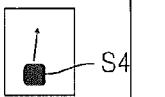

FIG. 5A shows the result of measuring the registration error of four different pattern elements, isolated from the result of measuring the main pattern elements in the main pattern region 110 of the photomask 100A shown in FIGS. 2A and 2B. In particular, in FIG. 5A, a pattern element A is shifted from the nominal position thereof by 4.46 nm and −0.26 nm in an X-axis direction and a Y-axis direction, respectively. A pattern element B is shifted by about −4.54 nm and 0.20 nm in the X-axis direction and the Y-axis direction, respectively, from the nominal position thereof, and a pattern element C is shifted by about −1.00 nm and −5.15 nm in the X-axis direction and the Y-axis direction, respectively, from the nominal position thereof. In addition, a pattern element D is shifted by about 0.51 nm and 4.36 nm in the X-axis direction and the Y-axis direction, respectively, from the nominal position thereof.

In operation P18, selection points S1, S2, S3, and S4 that are spaced apart from the nominal positions of the pattern elements A, B, C, and D in a second direction that is different from the shifted directions (first direction) are physically deformed so as to change strain of the photomask at the locations of the pattern elements A, B, C, and D.

The selection points S1, S2, S3, and S4 to be physically deformed may be selected from the non-pattern region of the photomask 110A shown in FIGS. 2A and 2B. For example, the selection points S1, S2, S3, and S3 may be selected from a region that does not include the pattern elements to be transferred to the wafer from among the black border region 130 and the auxiliary pattern region 120 of the photomask 100A shown in FIGS. 2A and 2B. Otherwise, the selection points S1, S2, S3, and S4 may be selected from a region of the main pattern region 110 of the photomask 100A shown in FIGS. 2A and 2B, wherein the region does not include the pattern elements for transferring the main patterns that are necessary for configuring the integrated circuit on the chip area of the wafer. According to some embodiments, the selection points S1, S2, S3, and S4 for physical deformation may include one selected location or a plurality of selected locations. The plurality of selected locations may be selected so as to form a shape that is continuously or intermittently connected.

According to some embodiments, an energy beam may be irradiated onto the selection points S1, S2, S3, and S4 to change the strain of the photomask at the locations of the pattern elements A, B, C, and D. According to some embodiments, the energy beam (EB) may be one of selected from an electron beam, a focused ion beam, a laser beam, and an electromagnetic beam.

FIGS. 3A and 3B show a corrected photomask 100B, in which an energy beam EB is irradiated onto a selection point SP1 selected from the back border region 130 to physically deform the selection point SP1, to correct the registration error in some of the main pattern elements 112 from among the plurality of main pattern elements 112 in the main pattern region 110A of the photomask 100A shown in FIGS. 2A and 2B. The corrected photomask 100B includes a deformation region 190 in a square denoted by dotted lines due to the energy beam EB on a vertical region corresponding to the location where the energy beam EB is irradiated in the black border region 130 on the photomask substrate 140.

As a result of irradiating the energy beam EB to the selection point SP1 of the photomask 100A (refer to FIGS. 2A and 2B), as shown in FIG. 3B, a thickness PD1 of the photomask 100B at the deformation region 190 may be less than a thickness PD2 of the photomask 100B at other region. In particular, a level of an upper surface of the photomask 100B in the deformation region 190 corresponding to the selection point SP1 to which the energy beam EB is irradiated may be lower than a level of the upper surface of the photomask 100B in a peripheral region of the deformation region 190.

Since the thickness of the photomask 100B is reduced in the deformation region 190 and the level of the upper surface of the absorber layer 170 is lowered, stress may be generated in a direction denoted by a plurality of arrows F around the deformation region 190 as shown in FIG. 3B. The stress generated around the deformation region 190 may change the strain to the location where the pattern element, the registration error of which is to be corrected, and accordingly, the registration error may be corrected at the location where the pattern element, the registration error of which is to be corrected.

According to some embodiments, when irradiating the energy beam EB onto the selection point SP1 selected from the non-pattern region of the photomask 100A to change the strain of the photomask at the location where the pattern element, the registration error of which is to be corrected, a separation distance between the pattern element that is to be corrected and the selection point SP1 may be adjusted to adjust a variation amount of the strain at the location of the pattern element to be corrected. For example, when the energy beam EB of a constant power is applied to the selection point SP1, as the separation distance between the pattern element to be corrected and the selection point to which the energy beam EB is applied increases, the variation amount of the strain at the pattern element to be corrected may be reduced. In addition, as the separation distance between the pattern element to be corrected and the selection point to which the energy beam EB is applied is reduced, the variation amount in the strain at the location of the pattern element to be corrected may be increased.

According to some embodiments, when irradiating the energy beam EB to the selection point SP1 selected from the non-pattern region of the photomask 100A to change the strain of the photomask at the location where the pattern element, the registration error of which is to be corrected, the separation distance between the pattern element to be corrected and the selection point SP1 may be adjusted so that a tensile stress may be applied to the location of the pattern element to be corrected. For example, when the separation distance between the pattern element to be corrected and the selection point SP1 is about 200 micrometers (μm) or less, the tensile stress may be applied to the location of the pattern element to be corrected.

According to some embodiments, when irradiating the energy beam EB onto the selection point SP1 selected from the non-pattern region of the photomask 100A to change the strain of the photomask at the location of the pattern element to be corrected, the separation distance between the pattern element to be corrected and the selection point SP1 may be adjusted so that a compressive stress may be applied to the pattern element to be corrected. For example, by selecting the separation distance between the pattern element to be corrected and the selection point SP1 in a range greater than about 200 μm, the compressive stress may be applied to the location of the pattern element to be corrected.

According to some embodiments, when irradiating the energy beam EB onto the selection point SP1 selected from the non-pattern region of the photomask 100A to change the strain of the photomask at the location of the pattern element to be corrected, a laser beam may be irradiated onto the selection point SP1 and a thickness variation amount ΔD of the photomask 100B may be adjusted by controlling the intensity of the laser beam to adjust the variation amount of the strain at the pattern element to be corrected. The thickness variation amount ΔD of the photomask 100B may correspond to a recessed depth ΔR of the upper surface of the absorber layer 170 toward the photomask substrate 140. That is, the recessed depth ΔR of the upper surface of the absorber layer 170 toward the photomask substrate 140, which is generated when irradiating the laser beam, may be determined by adjusting the intensity of the laser beam.

According to some embodiments, the energy beam EB may be irradiated onto the selection point SP1 in the non-pattern region of the photomask (refer to FIG. 2A) to change the strain of the photomask at the location of the pattern element to be corrected, and then, a density of at least a part of the vertical region from the selection point SP1 along the thickness direction of the photomask 100A may be increased. For example, by irradiating the laser beam onto the selection point SP1, the vertical region from the selection point SP1 along the thickness direction of the photomask 100A is annealed so that the deformation region 190 corresponding to the vertical region may have at least a portion having increased density in the multiple reflective layer 150. When the density of at least a part of the multiple reflective layer 150 is increased in the vertical region, the deformation region 190 may include at least a part of the multiple reflective layer 150, a volume of which is reduced.

If the multiple reflective layer 150 is formed as a multiple layer including a Si layer, the laser beam may be irradiated onto the selection point SP1 so that a temperature of the vertical region from the selection point SP1 in the thickness direction of the photomask 100A may reach at least a melting point of Si. Thus, the Si layer that is weak against the heat may react with an adjacent metal material to form a metal silicide or may be dispersed to other material layers, and accordingly, the thickness of the multiple reflective layer 150 may be reduced in the vertical region of the photomask 100A from the selection point SP1 along the thickness direction of the photomask 100A. Accordingly, the thickness of the deformation region 190 corresponding to the vertical region may be less than the other part where the laser beam is not irradiated. As described above, since the thickness of the multiple reflective layer 150 is locally reduced in the deformation layer 190, stress may be generated around the deformation region 190. In particular, the tensile stress may be applied to the region that is relatively closer to the selection point SP1 to which the laser beam is applied. An intensity and a direction in which the tensile stress is applied may be determined according to the location of the selection point SP1 and the thickness variation amount ΔD at the selection point SP1. Therefore, by appropriately adjusting the selection point SP1 where the energy beam EB is irradiated and the thickness variation amount ΔD of the photomask 100A at the selection point SP1 caused by the irradiation of the energy beam EB, the registration error of the main pattern elements 112 on the main pattern region 110 may be corrected effectively.

In FIG. 3B, upper surfaces of the plurality of absorber patterns 170P located on the pattern region of the photomask 100B may be located at the same levels as each other. Also, the multiple reflective layer 150 may have a constant density and a constant volume on the pattern region of the photomask 100B.

Figure 5B:
FIG. 5B is a diagram showing a result of correcting a registration error with respect to four pattern elements shown in the example of FIG. 5A, according to various embodiments of the present inventive concepts.
Figure 5B:
Figure 5B:
Figure 5B:

FIG. 5B shows a result of correcting the registration error with respect to four pattern elements A, B, C, and D shown in FIG. 5A, according to the operation P18 shown in FIG. 1, with reference to FIGS. 3A and 3B. In detail, FIG. 5B shows the result of correcting the registration error obtained when the laser beam is irradiated onto selection points S1, S2, S3, and S4 respectively corresponding to four pattern elements A, B, C, and D that are shown in the example of FIG. 5A so that the thickness of the photomask is reduced by about 30 nm from the upper surface of the selection points S1, S2, S3, and S4.

To obtain the result shown in FIG. 5B, the selection points S1, S2, S3, and S4 are set to be locations that are 100 μm apart from nominal positions of the four pattern elements A, B, C, and D, and when the laser beam is irradiated to the selection points S1, S2, S3, and S4, a laser pulse time period is about 0.5 ms and a size of the laser beam is about 300 μm×300 μm.

From the correction result of FIG. 5B, it may be recognized that the registration error shifted in left, right, upper, and lower directions by about 5 nm from the nominal positions before the correction was corrected to about 1 nm or less by correcting the registration error using the laser beam. As described herein, according to the correction of registration error by using the energy beam, the registration error in every direction may be corrected by appropriately selecting an application location of the energy beam and the intensity of the energy beam.

Figure 6:
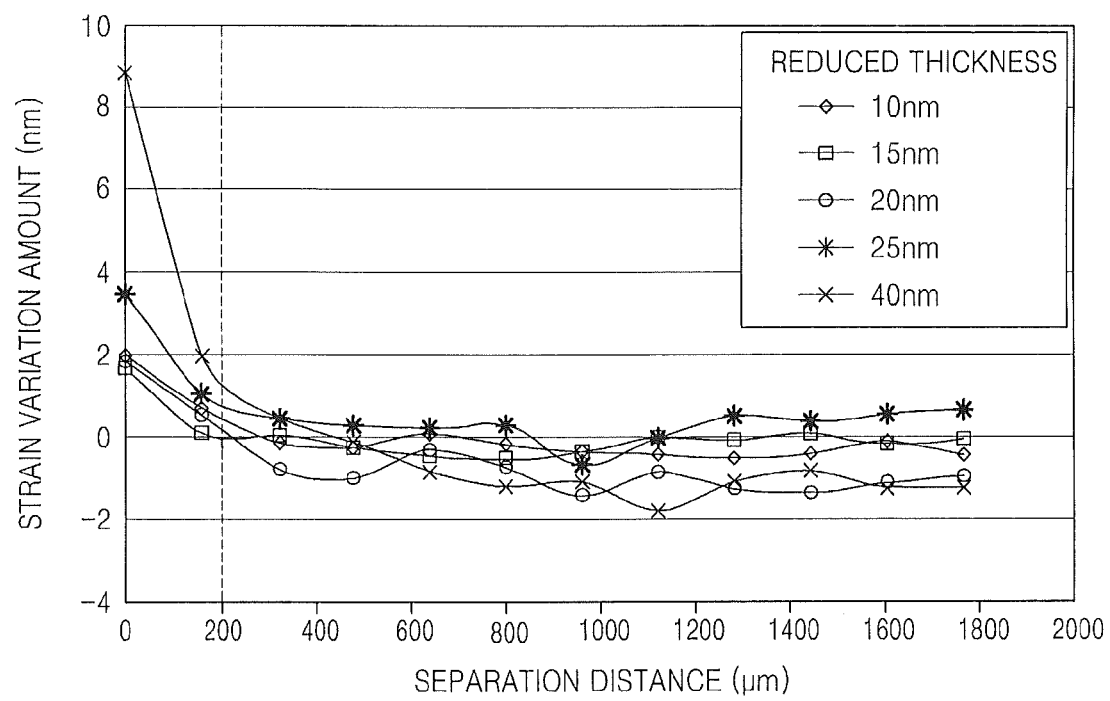
FIG. 6 is a graph showing a result of evaluating a strain variation amount according to a distance from a pattern element having a registration error and a selected point to which an energy beam is applied, in correcting the registration error of the photomask, according to various embodiments of the present inventive concepts.

FIG. 6 is a graph showing a result of evaluating the strain variation amount according to the separation distance from the pattern element having the registration error and the selection point to which the energy beam is applied, in the method of correcting the registration error of the photomask, according to various embodiments of the present inventive concepts. For evaluating as shown in FIG. 6, a photomask sample was made by forming a Cr backside conductive layer on the backside surface of a photomask substrate, and forming a multiple reflective layer including multiple layers of Mo/Si with 40 cycles, a buffer layer formed of Ru, an absorber layer formed of TaBN, and a low reflective layer formed of TaBO sequentially on the frontside surface of the photomask substrate.

A dose of the laser beam is controlled so that the intensity of the laser beams applied to the plurality of selection points is adjusted within a range of about 20 to about 80 Watts (W), and thus, the thickness reduction amounts of the photomask at the plurality of selection points selected from the frontside upper surface of the photomask sample may be 10 nm, 15 nm, 20 nm, 25 nm, and 40 nm, respectively. In addition, the strain variation amount at the pattern element to be corrected according to the distance from the pattern element to be corrected and the location to which the laser beam is applied for each selection point was measured. When applying the laser beam to each of the selection points, the laser pulse time period was about 0.5 ms and the size of the laser beam was about 300 μm×300 μm. To obtain the various thickness variation amounts as described herein, an energy density of the laser beam was adjusted within a range of about 1 to about 5 Joules/centimeter$^2$ (J/cm$^2$) during applying the laser beam to each of the selection points in the photomask sample.

In FIG. 6, when the strain variation amount is a positive value (+), the energy beam is irradiated onto the corresponding selection point so that the tensile stress is applied to the location of the pattern element, the registration error of which is to be corrected. In addition, when the strain variation amount is a negative value (−), the energy beam is applied to the corresponding selection point so that the compressive stress is applied to the location of the pattern element to be corrected.

According to the result shown in FIG. 6, in a case where the separation distance from the pattern element having the registration error and the selection point to which the energy beam is applied is about 200 μm or less, the tensile stress is applied to the pattern element.

According to the result of FIG. 6, it may be recognized that the strain variation amount is reduced when the separation distance from the pattern element having the registration error to be corrected to the selection point to which the laser beam is applied is increased. Also, when reducing the thickness of the photomask in the vertical direction at the selection point to which the laser beam is irradiated by controlling the dose of the laser beam, the strain variation amount is increased when the thickness reduction amount of the photomask is increased. Therefore, by appropriately selecting the thickness variation amount of the photomask according to the irradiation of the laser beam and the location to which the laser beam is irradiated, the registration error in the main pattern region of the photomask may be effectively controlled.

Figure 7A:
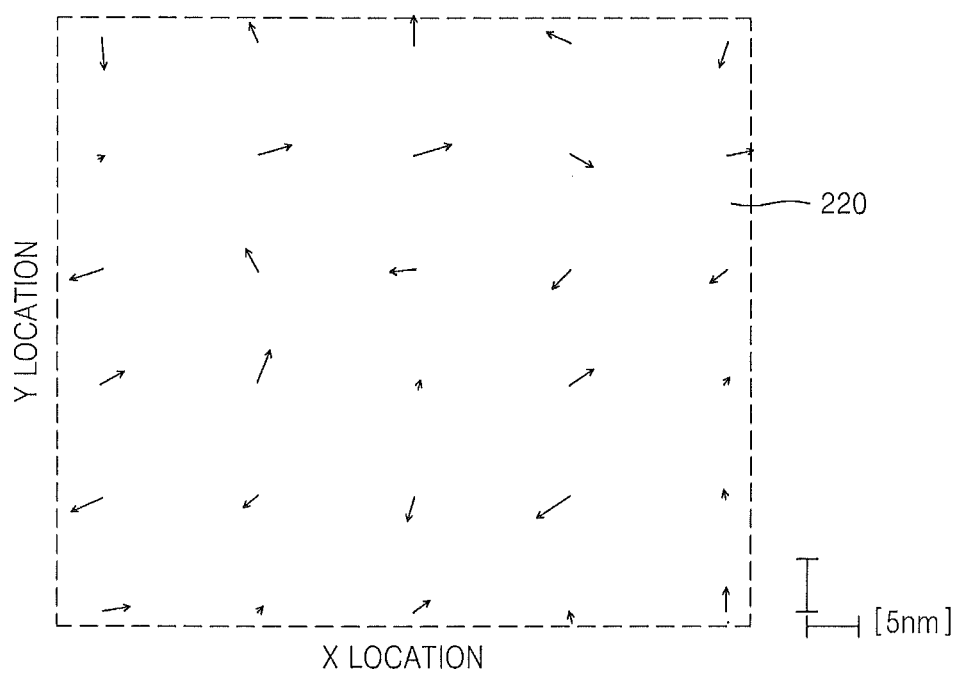
FIG. 7A is a 2D map showing a result of correcting a registration error of a photomask, according to various embodiments of the present inventive concepts.

FIG. 7A is a 2D map 220 showing a result of correcting the registration error of the photomask by using the correction method according to various embodiments of the present inventive concepts. In more detail, in a state where the registration error is generated in the photomask 100A (refer to FIG. 2A) as shown in the 2D map 210 of FIG. 4, the laser beam is irradiated onto the plurality of selection points selected from the black border region 130 of the photomask 100A so that the thickness of the photomask 100A is reduced by about 10 nm at the plurality of selection points. Thus, the registration error in the main pattern region 110A may be corrected, and the 2D map 220 shown in FIG. 7A is obtained.

Figure 7B:
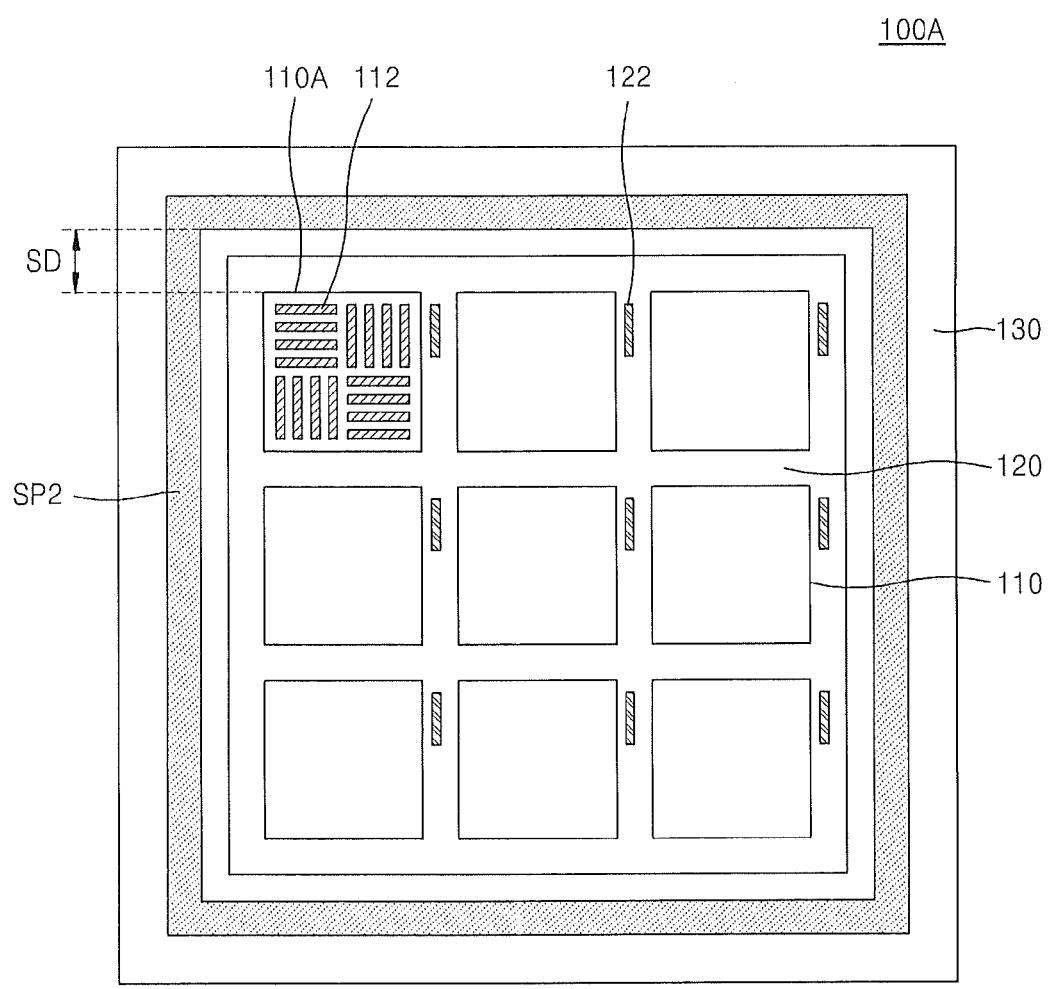
FIG. 7B is a plan view of a photomask, on which a selection point where a laser beam is irradiated, is marked to obtain the 2D map of FIG. 7A.

FIG. 7B shows a selection point SP2 to which the laser beam is irradiated in the black border region 130 of the photomask 100A (refer to FIG. 2A) to obtain the 2D map 220 of FIG. 7A. A plurality of separate selection points partially overlap with each other, and then, the selection point SP2 having a continuously connected linear shape is obtained as shown in FIG. 7B. The selection point SP2 is separated about a distance SD of 100 μm from the main pattern region 110A including the plurality of main pattern elements 112 having the registration error to be corrected.

In the 2D map 220 of FIG. 7A, a maximum 3-sigma in the X-axis direction is 11.3 nm and a maximum 3-sigma in the Y-axis direction is 9.89 nm. Since the maximum 3-sigma in the Y-axis direction in the 2D map 210 of FIG. 4 is 10.74 nm, the maximum 3-sigma in the Y-axis direction is improved by about 0.85 nm after correcting the registration error.

As described above, according to the method of correcting the registration error of some embodiments of the present inventive concepts, the energy beam is irradiated to the selection point that is a predetermined distance apart from the pattern element having the registration error to be corrected to heat the selection point, and accordingly, the structure of the vertical region of the photomask from the selection point toward the photomask substrate is physically changed so as to change the strain at the main pattern elements. Therefore, the registration error of the main pattern elements may be corrected. Accordingly, the registration error of the photomask may be corrected effectively without causing a critical dimension (CD) change of the pattern transferred onto the wafer from the main pattern elements having the registration error.

Figure 8A:
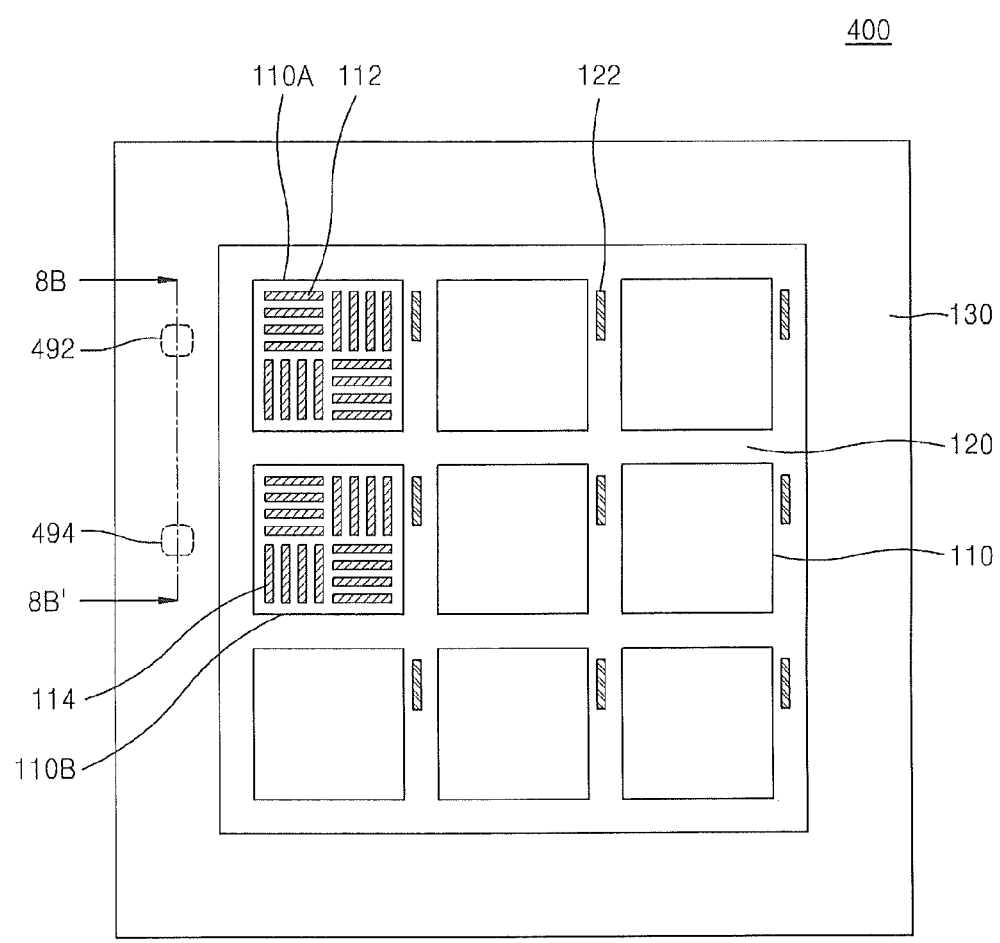
FIG. 8A is a plan view of a photomask, according to various embodiments of the present inventive concepts.
Figure 8B:
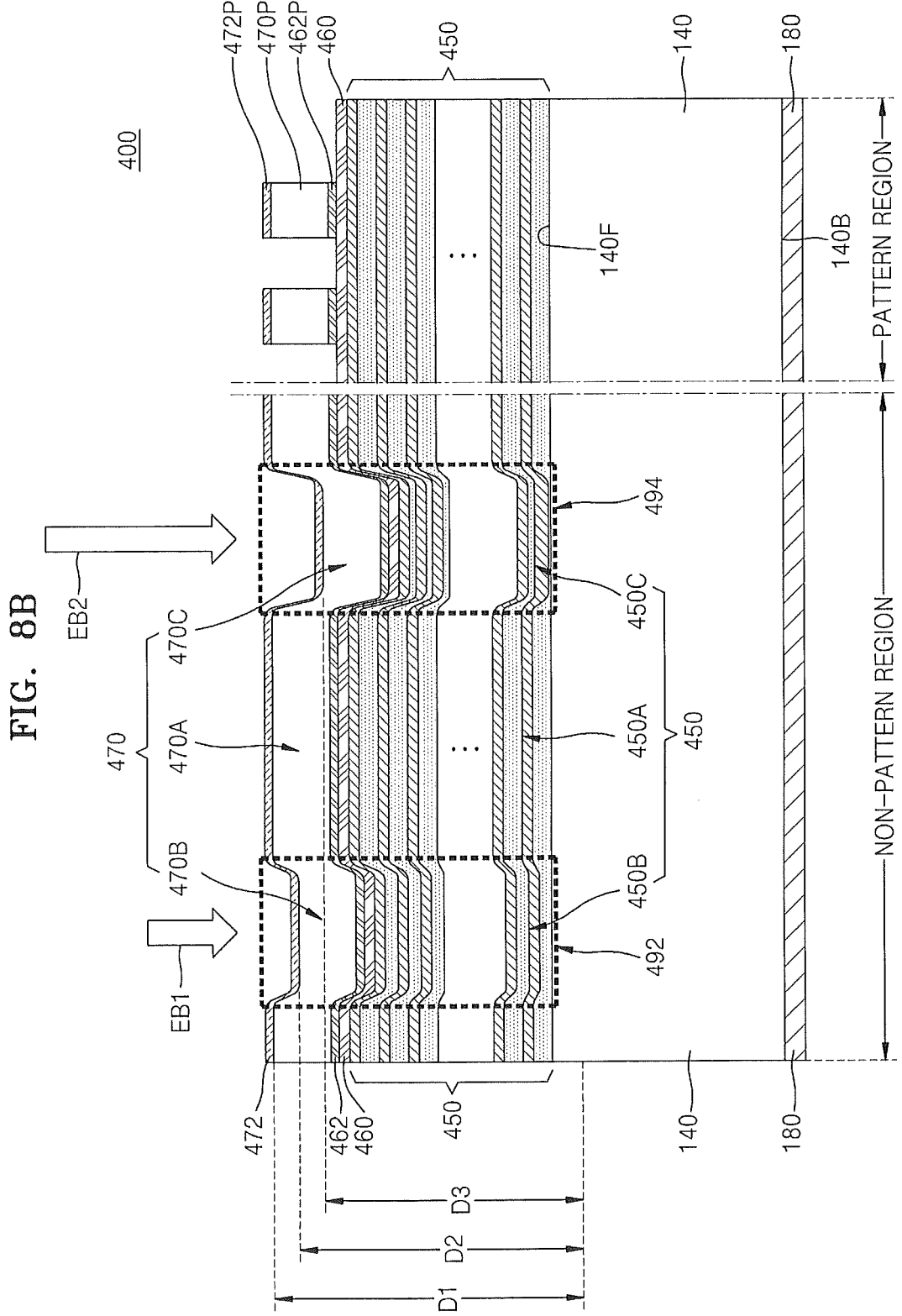
FIG. 8B is a cross-sectional view showing a partial region of the photomask, according to various embodiments of the present inventive concepts.

FIG. 8A is a schematic plan view of a photomask 400 according to some embodiments of the present inventive concepts, and FIG. 8B is a cross-sectional view showing a part of the photomask 400 of FIG. 8A. In FIG. 8B, a non-pattern region may correspond to a cross-section taken along a line 8B-8B' of FIG. 8A.

FIGS. 8A and 8B show the reflective type photomask 400 for transferring patterns on a wafer by using EUV light having a wavelength of about 13.5 nm and a reflective type exposure system. In FIGS. 8A and 8B, reference numerals that are the same as those of FIGS. 3A and 3B denote the same elements, and repeated detailed descriptions thereof may be omitted.

Referring to FIGS. 8A and 8B, the photomask 400 includes a photomask substrate 140 including a main pattern region 110, an auxiliary pattern region 120, and a black border region 130. In the non-pattern region in the main pattern region 110, the auxiliary pattern region 120, and the black border region 130, a multiple reflective layer 450, a capping layer 460, a buffer layer 462, an absorber layer 470, and a low reflective layer 472 are sequentially formed on a frontside surface 140F of the photomask substrate 140. According to some embodiments, at least one of the buffer layer 462 and the low reflective layer 472 may be omitted. A backside conductive layer 180 is formed on a backside surface 140B of the photomask substrate 140.

In the pattern region of the main pattern region 110 and the auxiliary pattern region 120, the multiple reflective layer 450 and the capping layer 460 are sequentially formed on the frontside surface 140F of the photomask substrate 140, similarly to the non-pattern region. In addition, a buffer pattern 462P, an absorber pattern 470P, and a low reflective pattern 472P defining pattern elements of predetermined shapes are sequentially formed on the capping layer 460. In addition, the backside conductive layer 180 is formed on the backside surface 140B of the photomask substrate 140.

The detailed configurations of the multiple reflective layer 450, the capping layer 460, the buffer layer 462, the buffer pattern 462P, the absorber layer 470, the absorber pattern 470P, the low reflective layer 472, and the low reflective pattern 472P may be the same as those of the multiple reflective layer 150, the capping layer 160, the buffer layer 162, the buffer pattern 162P, the absorber layer 170, the absorber pattern 170P, the low reflective layer 172, and the low reflective pattern 172P with reference to FIGS. 2A and 2B.

According to some embodiments, the non-pattern region of FIG. 8B corresponds to the cross-section taken along line 8B-8B' of FIG. 8A; however, embodiments of the present inventive concepts are not limited thereto. In some embodiments of the present inventive concepts, the non-pattern region shown in FIG. 8B may correspond to a partial cross-section in the auxiliary pattern region 120 of the photomask 400. In some embodiments of the present inventive concepts, the non-pattern region of FIG. 8B may correspond to a cross-section of a region, on which there is no pattern element to be transferred onto the chip region of the wafer, in the main pattern region 110 of the photomask 400.

According to some embodiments, the pattern region of the photomask 400 shown in FIG. 8B may correspond to a cross-sectional area of the region, on which the main pattern elements to be transferred onto the chip region of the wafer are formed, in the main pattern region 110. According to some embodiments, the pattern region of the photomask 400 shown in FIG. 8B may correspond to a cross-section of a region where auxiliary pattern elements 122 for transferring auxiliary patterns that are necessary in manufacturing the integrated circuit and do not remain on a final product of the integrated circuit, for example, align key patterns on the scribe line region of the wafer are formed.

The non-pattern region of the photomask 400 includes a plurality of deformation regions 492 and 494 that are physically deformed by the irradiation of the energy beams EB1 and EB2. In FIG. 8A, two deformation regions 492 and 494 are formed on the black border region 430; however, embodiments of the present inventive concepts are not limited thereto. That is, the number and shape of the deformation regions may vary within the scope of the present inventive concepts.

In the photomask 400, upper surfaces of the plurality of deformation regions 492 and 494 are located at a level that is different from that of other portions in the non-pattern region of the photomask 400. Therefore, the upper surfaces of the plurality of deformation regions 492 and 494 may be stepped from the upper surface of the other portions in the non-pattern region of the photomask 400. According to some embodiments, the upper surfaces of the plurality of deformation regions 492 and 494 may be located at different levels from each other.

The plurality of deformation regions 492 and 494 are formed by irradiating the energy beams EB1 and EB2 onto some portions selected from the non-pattern region, to correct the registration error generated in at least some main pattern elements 112 and 114 from among the plurality of main pattern elements 112 and 114 in main pattern regions 110A and 110B of the photomask 400. By irradiating the energy beams EB1 and EB2 onto a plurality of selection points selected from the non-pattern region, the deformation regions 492 and 494 are formed in two square regions denoted by dotted lines in vertical regions corresponding to the portions where the energy beams EB1 and EB2 are irradiated, on the photomask substrate 140 of the photomask 400.

The energy beams EB1 and EB2 may be selected from among an electron beam, a focused ion beam, a laser beam, and an electromagnetic beam. In addition, energy of the energy beam EB2 may be greater than that of the energy beam EB1. Thus, an annealing temperature caused by the energy beam EB2 applied to the vertical region extending from the selection point where the energy beam EB2 is irradiated to the photomask substrate 140 may be higher than that caused by the energy beam EB1 applied to the vertical region extending from the selection point where the energy beam EB1 is irradiated to the photomask substrate 140.

Since the plurality of deformation regions 492 and 494 are formed on the non-pattern region of the photomask 400, the absorber layer 470 includes a plurality of absorbing regions 470A, 470B, and 470C, upper surfaces of which are formed at different distances D1, D2, and D3 from the photomask substrate 140, in the non-pattern region. Since the plurality of absorbing regions 470A, 470B, and 470C have the upper surfaces at different levels from each other, stress may be locally applied to a part of the main pattern region 110.

The plurality of absorbing regions 470A, 470B, and 470C include a first absorbing region 470A that is separated a first distance D1 from the photomask substrate 140, a second absorbing region 470B that is separated a second distance D2 that is less than the first distance D1 from the photomask substrate 140, and a third absorbing region 470C separated a third distance D3 that is less than the second distance D2 from the photomask substrate 140. In some embodiments, the absorber layer 470 includes three regions having the upper surfaces at different levels from each other; however, embodiments of the present inventive concepts are not limited thereto. For example, the absorber layer 470 may include three or more absorbing regions having upper surfaces at different levels from each other according to locations of the pattern elements to be corrected and degrees of the registration error in the pattern elements.

According to some embodiments, the non-pattern region shown in FIG. 8B may correspond to at least one of the auxiliary pattern region 120 and the black border region 130 shown in FIG. 8A. According to some embodiments, the non-pattern region shown in FIG. 8B may correspond to a part of the main pattern region 110 shown in FIG. 8A, where the part does not include pattern elements to be transferred onto the wafer.

In the non-pattern region of the photomask 400, the multiple reflective layer 450 disposed between the photomask substrate 140 and the absorber layer 470 includes a plurality of reflective regions 450A, 450B, and 450C having different densities from each other under the plurality of absorbing regions 470A, 470B, and 470C. The plurality of reflective regions 450A, 450B, and 450C include a first reflective region 450A, a second reflective region 450B, and a third reflective region 450C.

The first reflective region 450A may vertically overlap with the first absorbing region 470A. The second reflective region 450B may vertically overlap with the second absorbing region 470B. In addition, the third reflective region 450C may vertically overlap with the third absorbing region 470C.

When the energy beams EB1 and EB2 are irradiated from the front portion of the photomask substrate 140 to form the photomask 400, a density of at least a part of the vertical region of the photomask 400 along with the thickness direction of the photomask 400 from the locations where the energy beams EB1 and EB2 are irradiated may be increased. In particular, due to the irradiation of the energy beams EB1 and EB2, the vertical regions extending from the locations where the energy beams EB1 and EB2 are irradiated in the thickness direction of the photomask 400 are annealed so that the density of at least a part of the multiple reflective layer 450 in each of the vertical regions may be increased. Since the density of at least a part of the multiple reflective layer 450 in each vertical region is increased, a volume of the multiple reflective layer 450 in the vertical region may be reduced. According to some embodiments, the increasing amount of the density and the reduction amount of the volume of the multiple reflective layer 450 may depend upon the power of the energy beams EB1 and EB2.

If the multiple reflective layer 450 includes S1, the energy beams EB1 and EB2 are irradiated so that the temperature of the vertical regions extending from the locations where the energy beams EB1 and EB2 are irradiated in the thickness direction of the photomask 400 may reach at least a melting point of the S1, and thus, the S1 layer that is relatively weak against heat may react adjacent metal materials to form a metal silicide or may be dispersed to other material layers, and then, the thickness of the multiple reflective layer 450 may be reduced at the vertical region. Accordingly, the thickness of the photomask 400 at the deformation regions 492 and 494 corresponding to the vertical regions may be less than that of the other portion(s) where the energy beams EB1 and EB2 are not irradiated.

According to some embodiments, if the multiple reflective layer 450 includes the S1 layer, the density of the S1 layer in the second reflective region 450B and the third reflective region 450C may be greater than the other portion of the multiple reflective layer 450. According to some embodiments, if the multiple reflective layer 450 includes the S1 layer, a unit volume of the S1 layer in the second reflective region 450B and the third reflective region 450C may be less than that of the other portion of the multiple reflective layer 450.

According to some embodiments, the first reflective region 450A from among the plurality of reflective regions 450A, 450B, and 450C may have a first density that is substantially the same as the density of the multiple reflective region 450 disposed in the pattern region of the photomask 400. The second reflective region 450B may have a second density that is greater than the first density. The third reflective region 450C may have a third density that is greater than the second density.

In the deformation regions 492 and 494, the thickness of the second and third reflective regions 450B and 450C of the multiple reflective layer 450 is less than that of the other portion, and accordingly, the second and third absorbing regions 470B and 470C of the absorber layer 470, which are located above the second and third reflective regions 450B and 450C, are moved toward the photomask substrate 140, and the level of the upper surfaces of the second and third absorbing regions 470B and 470C may be lowered. Therefore, similarly to the arrows F shown in FIG. 3B, stress may be generated around the deformation regions 492 and 494. The stress generated around the deformation regions 492 and 494 may affect the locations where the pattern elements having the registration error to be corrected, and accordingly, the strain may be changed at the locations of the pattern element to be corrected and the registration error may be corrected.

In FIG. 8B, upper surfaces of the plurality of absorber patterns 470P located in the pattern region of the photomask 400 may be located at the same level as each other. Also, the multiple reflective layer 450 may have a constant density and a constant volume in the pattern region of the photomask 400.

Figure 9:
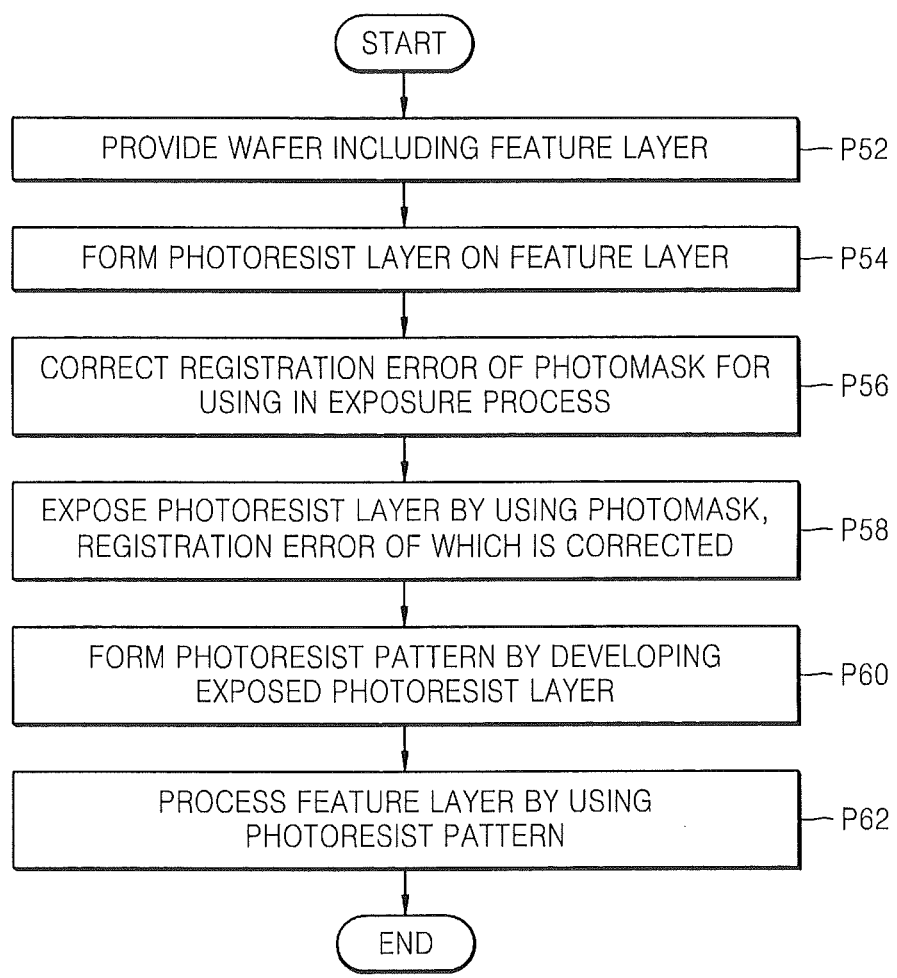
FIG. 9 is a flowchart illustrating a method of manufacturing an integrated circuit, according to various embodiments of the present inventive concepts.

FIG. 9 is a flowchart illustrating a method of manufacturing an integrated circuit, according to various embodiments of the present inventive concepts. In operation P2, a wafer including a feature layer is provided. According to some embodiments, the feature layer may be a conductive layer or an insulating layer formed on the wafer. For example, the feature layer may be formed of metal, semiconductor, or an insulating material. According to some embodiments, the feature layer may be a part of the wafer.

In operation P54, a photoresist layer is formed on the feature layer. The photoresist layer may be formed of a resist material for EUV light (13.5 nm); however, embodiments of the present inventive concepts are not limited thereto. For example, the photoresist layer may be formed of a resist for a fluorine ($F_2$) excimer laser (157 nm), a resist for an argon fluoride (ArF) excimer laser (193 nm), or a resist for a krypton fluoride (KrF) excimer laser (248 nm). The photoresist layer may be a positive type photoresist or a negative type photoresist.

To form the photoresist layer formed as the positive type photoresist, a photoresist composition including a photosensitive polymer having an acid-labile group, a potential acid, and a solvent may be spin coated on the feature layer.

According to some embodiments, the photosensitive polymer may include a (meth)acrylate-based polymer. The (meth)acrylate-based polymer may be an aliphatic (meth)acrylate-based polymer. For example, the photosensitive polymer may be polymethylmethacrylate (PMMA), poly(t-butylmethacrylate), poly(methacrylic acid), poly(norbornyl methacrylate), a copolymer or terpolymer of repeating units of the above (meth)acrylate-based polymers, or a combination thereof. Also, the photosensitive polymers may be substituted with various acid-labile protecting groups. The protecting group may include tertbutoxycarbonyl (t-BOC) group, tetrahydropyranyl group, trimethylsilyl group, phenoxyethyl group, cyclohexenyl group, tert-butoxycarbonylmethyl group, tert-butyl group, adamantyl group, or norbornyl group. However, embodiments of the present inventive concepts are not limited thereto.

The potential acid may be a photoacid generator (PAG), thermoacid generator (TAG), or a combination thereof. The PAG may be formed of a material that generates acid when being exposed to one selected from among the EUV light (1-31 nm), $F_2$ excimer laser (157 nm), ArF excimer laser (193 nm), and KrF excimer laser (248 nm). The PAG may include onium salt, halogen compound, nitrobenzyl esters, alkyl sulfunates, diazonaphthoquinones, iminosulfonates, disulfones, diazomethanes, and sulfonyl oxy ketones.

In operation P56, the registration error of the photomask to be used in the exposure process is corrected. The photomask of some embodiments may have a structure of the photomask 100A described with reference to FIG. 2B before correcting the registration error.

In operation S56, to correct the registration error of the photomask, the method of correcting the registration error in the photomask described with reference to FIGS. 1 through 5B may be used. After correcting the registration error of the photomask in operation P56, the photomask may have the structure of the photomask 100B shown in FIG. 3B or the photomask 400 shown in FIG. 8B.

According to some embodiments, as illustrated in FIG. 9, the operation P56 is performed after the operation P54; however, embodiments of the present inventive concepts are not limited thereto. That is, the operation P56 may be performed regardless of the order of the operation P52 and the operation P54, and may be performed in any step before performing operation P58.

In operation P58, the photoresist layer formed in the operation P54 is exposed in a reflective type exposure system by using the photomask, the registration error of which is corrected according to the operation P56. In the exposure process, the photoresist layer may be exposed to the EUV light that is reflected by the photomask.

In the exposure process, the photoresist layer may be exposed to the EUV light that is reflected from the portion having the constant density in the multiple reflective layer of the photomask. According to some embodiments, the photoresist layer may be exposed to the EUV light reflected from the multiple reflective layer 150 located in the pattern region of the photomask 100B shown in FIG. 3B. According to some embodiments, the photoresist layer may be exposed to the EUV light reflected from the multiple reflective layer 450 located in the pattern region of the photomask 400 shown in FIG. 8B.

In operation P60, the photoresist layer is developed to form a photoresist pattern. In operation P62, the feature layer is processed by using the photoresist pattern. To process the feature layer in the operation P62, the feature layer may be etched by using the photoresist pattern as an etching mask, and thus, fine feature patterns may be formed.

According to some embodiments, to process the feature layer in the operation P62, impurity ions may be implanted into the feature layer by using the photoresist pattern as an ion implantation mask. According to some embodiments, to process the feature layer in the operation P62, an additional process film may be formed on the feature layer that is exposed via the photoresist pattern formed in the operation P60. The process film may be a conductive film, an insulating film, a semiconductor film, or a combination thereof.

Figure 10:
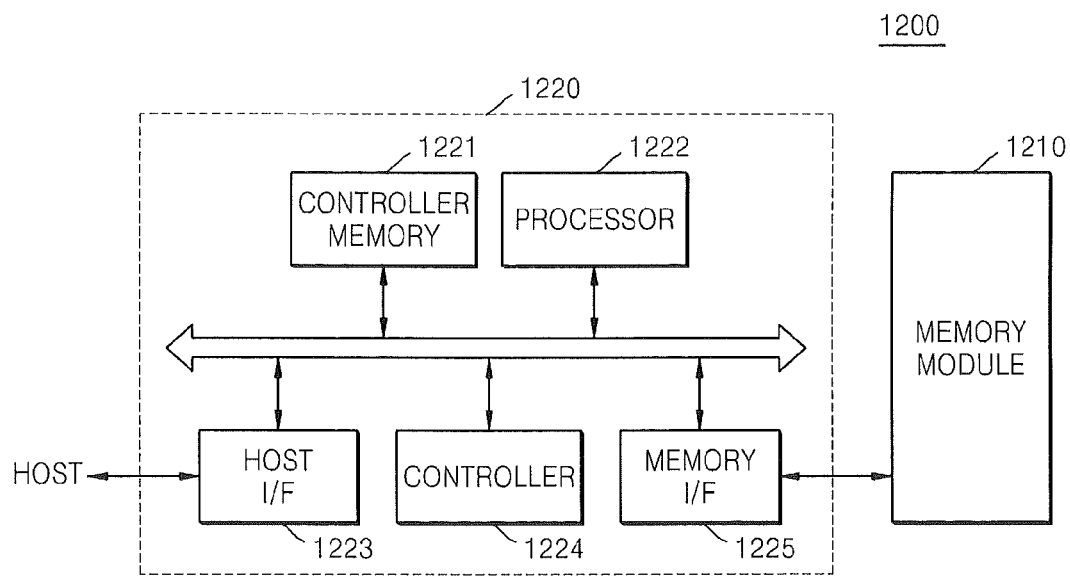
FIG. 10 is a block diagram of a memory card including an integrated circuit that is manufactured by using a manufacturing method according to various embodiments of the present inventive concepts.

FIG. 10 is a block diagram of a memory card 1200 including an integrated circuit that is manufactured by a method according to various embodiments of the present inventive concepts. The memory card 1200 includes a memory controller 1220 generating commands and address signal C/A, a memory module 1210, and a flash memory including, for example, one or a plurality of flash memory devices. The memory controller 1220 includes a host interface (I/F) 1223 transmitting commands and address signals to a host or receiving the commands and address signals from the host, and a memory interface 1225 transmitting the commands and address signals to the memory module 1210 or receiving the commands and address signals from the memory module 1210. The host interface 1223, a controller 1224, and the memory interface 1225 communicate with a controller memory 1221 such as a static random access memory (SRAM) and a processor 1222 such as a central processing unit (CPU) via a common bus.

The memory module 1210 receives the command and address signal from the memory controller 1220, and stores data in at least one of memory devices in the memory module 1210 and searches for the data from at least one of the memory devices in response to the input signal. Each of the memory devices may include a plurality of addressable memory cells, and a decoder receiving the command and address signal and generating a column signal and a row signal to access at least one of the memory cells during programming and reading operations.

Components of the memory card 1200 including the memory controller 1220, electronic devices 1221, 1222, 1223, 1224, and 1225 included in the memory controller 1220, and the memory module 1210 may include integrated circuits manufactured by using a method of manufacturing the integrated circuit according to some embodiments of the present inventive concepts. Also, components of the memory card 1200 including the memory controller 1220, electronic devices 1221, 1222, 1223, 1224, and 1225 included in the memory controller 1220, and the memory module 1210 may include the integrated circuits manufactured by using the photomask 100B shown in FIG. 3B or the photomask 400 shown in FIG. 8B.

Figure 11:
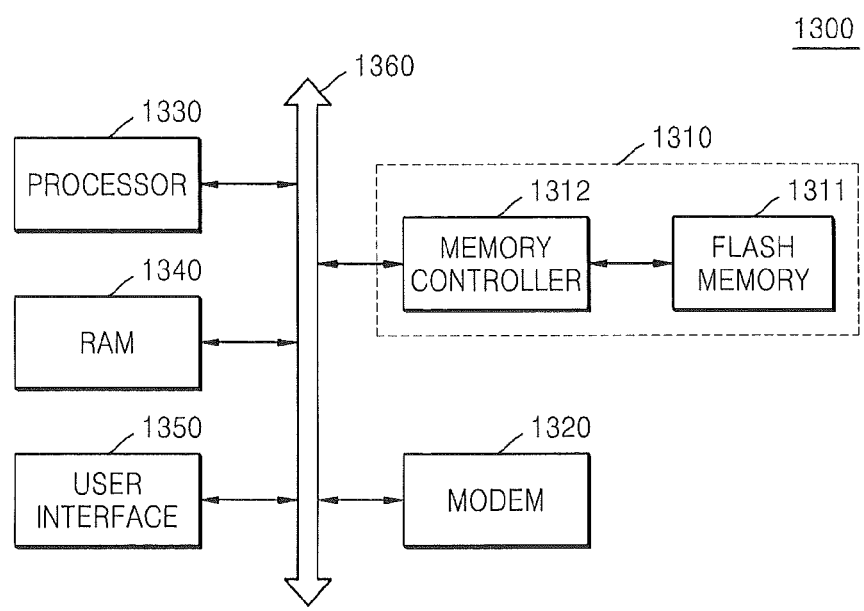
FIG. 11 is a block diagram of a memory system adopting a memory card that comprises an integrated circuit manufactured by a manufacturing method according to various embodiments of the present inventive concepts.

FIG. 11 is a block diagram of a memory system 1300 adopting a memory card 1310 including an integrated circuit manufactured by a method of manufacturing the integrated circuit according to various embodiments of the present inventive concepts. The memory system 1300 may include a processor 1330 such as a CPU, a random access memory (RAM) 1340, a user interface 1350, and a modem 1320 communicating with each other via a common bus 1360. Each of the devices may transmit a signal to the memory card 1310, and receive a signal from the memory card 1310 via the common bus 1360. The components of the memory system 1300 including the processor 1330, the RAM 1340, the user interface 1350, and the modem 1320 with the memory card 1310 may include integrated circuits manufactured by a method of manufacturing the integrated circuit according to some embodiments of the present inventive concepts. In particular, each of the components in the memory system 1300 may include the integrated circuit manufactured by using the photomask 100B shown in FIG. 3B or the photomask 400 shown in FIG. 8B.

The memory system 1300 may be applied to various electronic application fields. For example, the memory system 1300 may be applied to solid state drives (SSDs), complementary metal oxide semiconductor (CMOS) image sensors (CISs), and computer application chip sets.

The memory systems and devices described in the present specification may be packaged in any of various device package types, for example, a ball grid array (BGA), a chip scale package (CSP), a plastic leaded chip carrier (PLCC), a plastic dual in-line package (PDIP), a multi-chip package (MCP), a wafer-level fabricated package (WFP), a wafer-level processed stock package (WSP), etc.; however, embodiments of the present inventive concepts are not limited thereto.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of reducing a registration error of a photomask, the method comprising:
   measuring the registration error with respect to a pattern element in a main pattern region configured to transfer main patterns for an integrated circuit on a chip region of a wafer, wherein the photomask comprises the main pattern region, an auxiliary pattern region configured to transfer auxiliary patterns on a scribe line region of the wafer, and a black border region around the main pattern region and the auxiliary pattern region, and wherein the photomask comprises a photomask substrate and a multi-layer pattern on the photomask substrate;
   identifying a first direction, to which the pattern element is shifted from a nominal position, using a result of measuring the registration error; and
   changing a strain of the photomask at a location of the pattern element by physically deforming a portion of the multi-layer pattern of the photomask at a selection point that is spaced apart from the location of the pattern element in a second direction that is different from the first direction and is in at least one of the auxiliary pattern region and the black border region.

2. The method of claim 1, wherein changing the strain comprises determining a distance from the location of the pattern element to the selection point to adjust a variation amount of the strain.

3. The method of claim 1, wherein changing the strain comprises applying a tensile stress to the location of the pattern element.

4. The method of claim 1, wherein changing the strain comprises reducing a thickness of the portion of the multi-layer pattern of the photomask at the selection point.

5. The method of claim 1, wherein changing the strain comprises controlling a thickness variation amount of the portion of the multi-layer pattern of the photomask at the selection point to adjust a variation amount of the strain.

6. The method of claim 1, wherein changing the strain comprises increasing a density of the portion of the multi-layer pattern of the photomask at the selection point.

7. The method of claim 1, wherein changing the strain comprises reducing a thickness of the portion of the multi-layer pattern of the photomask at the selection point such that an upper surface of the photomask at the selection point is at a first level lower than a second level at which an upper surface of an adjacent portion of the photomask is located.

8. The method of claim 1, wherein changing the strain comprises irradiating an energy beam onto the selection point.

9. The method of claim 8, wherein the energy beam comprises one of an electron beam, a focused ion beam, a laser beam, and an electromagnetic beam.

10. The method of claim 4, wherein
changing the strain comprises increasing a temperature of the portion of the multi-layer pattern of the photomask at the selection point to a melting point of at least one layer of the multi-layer pattern to reduce a volume of the multi-layer pattern.

11. A method of reducing a registration error of a photomask, the method comprising:
identifying the registration error with respect to a pattern element in a pattern region of the photomask;
selecting a location on a non-pattern region of the photomask that is a predetermined distance apart from the pattern element; and
reducing a thickness of a portion of the non-pattern region of the photomask by irradiating an energy beam onto the location of the non-pattern region of the photomask that is the predetermined distance apart from the pattern element, to generate stress at the pattern element.

12. The method of claim 11,
wherein the photomask comprises a photomask substrate and a multi-layer pattern on the photomask substrate, and
wherein irradiating the energy beam onto the location of the non-pattern region comprises heating a portion of the multi-layer pattern in the location of the non-pattern region of the photomask to reduce a thickness of the portion of the multi-layer pattern.

13. The method of claim 12,
wherein the photomask comprises an extreme ultraviolet (EUV) photomask,
wherein identifying the registration error comprises identifying the registration error with respect to the pattern element in the pattern region of the EUV photomask, and
wherein heating the portion of the multi-layer pattern comprises controlling the registration error with respect to the pattern element in the pattern region of the EUV photomask by controlling the thickness of the portion of the multi-layer pattern.

14. The method of claim 11, wherein irradiating the energy beam onto the location of the non-pattern region comprises controlling an intensity of the energy beam to control the stress at the pattern element.

15. The method of claim 11,
wherein selecting the location comprises selecting first and second locations on the non-pattern region of the photomask, and
wherein reducing the thickness comprises reducing first and second thicknesses of first and second portions, respectively, of the non-pattern region of the photomask by irradiating first and second energy beams comprising respective first and second intensities onto the first and second locations, respectively, of the non-pattern region of the photomask.

16. The method of claim 15,
wherein the photomask comprises a photomask substrate and a multi-layer pattern on the photomask substrate, and
wherein reducing the first and second thicknesses of the first and second portions of the non-pattern region of the photomask comprises heating a first portion of the multi-layer pattern in the first location and a second portion of the multi-layer pattern in the second location to reduce thicknesses of the first and second portions of the multi-layer pattern.

17. The method of claim 16, wherein the multi-layer pattern comprises a reflective layer, and
wherein heating the first portion of the multi-layer pattern in the first location and the second portion of the multi-layer pattern in the second location reduces thicknesses of portions of the reflective layer in the first and second locations of the non-pattern region of the photomask.

18. The method of claim 12,
wherein the multi-layer pattern comprises a reflective layer, and
wherein heating the portion of the multi-layer pattern reduces a thickness of a portion of the reflective layer in the location of the non-pattern region of the photomask.

19. The method of claim 18,
wherein the reflective layer comprises a silicon layer, and
wherein heating the portion of the multi-layer pattern comprises heating the portion of the multi-layer pattern at least to a melting point of silicon.

20. The method of claim 10, wherein the at least one layer of the multi-layer pattern comprises a reflective layer comprising a silicon layer, and
wherein changing the strain comprises reducing a volume of the silicon layer.

* * * * *